US012635458B2

(12) United States Patent (10) Patent No.: US 12,635,458 B2

Nerwal et al. (45) Date of Patent: May 19, 2026

(54) SUBSTRATE STORAGE RACKS FOR SEMICONDUCTOR PROCESSING SYSTEMS

(71) Applicant: ASM IP Holding B.V., Almere (NL)

(72) Inventors: Gurupkar Nerwal, Tempe, AZ (US);
Senthil Sivaraman, Chennai (IN)

(73) Assignee: ASM IP Holding B.V., Almere (NL)

( * ) Notice: Subject to any disclaimer, the term of this patent is extended or adjusted under 35 U.S.C. 154(b) by 833 days.

(21) Appl. No.: 17/980,100

(22) Filed: Nov. 3, 2022

(65) Prior Publication Data

US 2023/0143667 A1 May 11, 2023

Related U.S. Application Data

(60) Provisional application No. 63/276,918, filed on Nov. 8, 2021.

(51) Int. Cl.
H10P 72/10 (2026.01)
H10P 72/00 (2026.01)
H10P 72/30 (2026.01)
H10P 72/76 (2026.01)

(52) U.S. Cl.
CPC ........ H10P 72/145 (2026.01); H10P 72/0454 (2026.01); H10P 72/3408 (2026.01); H10P 72/7602 (2026.01)

(58) Field of Classification Search
CPC ......... H01L 21/67167; H01L 21/68707; H01L 21/67775; H01L 21/67346; H01L 21/67323; H01L 21/67386; H01L 21/67326; H01L 21/67265; H01L 21/6732; H01L 21/67781; H01L 21/67309; H01L 21/6875; H01L 21/6734; H01L 21/6735; H01L 21/67363; H01L 21/67769; H01L 21/67369; H01L 21/67383; H01L 21/67763; H10P 72/0454; H10P 72/0608; H10P 72/18; H10P 72/145; H10P 72/1922; H10P 72/15; H10P 72/14; H10P 72/127; H10P 72/17; H10P 72/19; H10P 72/1908; H10P 72/1912; H10P 72/1921; H10P 72/7602; H10P 72/3408; H10P 72/3412; H10P 72/7614; H10P 72/3404; H10P 72/34
See application file for complete search history.

(56) References Cited

U.S. PATENT DOCUMENTS

| | | | | |
|---|---|---|---|---|
| 3,648,962 | A | | 3/1972 | Farley |
| 4,708,252 | A | | 11/1987 | Azzi |
| 5,634,748 | A | | 6/1997 | Brazell |
| 5,788,458 | A | * | 8/1998 | Bonora ............. H01L 21/67772 |
| | | | | 414/811 |

(Continued)

*Primary Examiner* — Glenn F Myers

(74) *Attorney, Agent, or Firm* — Snell & Wilmer L.L.P.

(57) ABSTRACT

A substrate storage rack for a semiconductor processing system includes a bottom plate, a top plate, and a column assembly. The top plate is spaced apart from the bottom plate, the column assembly connects the top plate to the bottom plate, and a ball member is compressively seated within the column assembly. The ball member protrudes from the column assembly in a direction toward the top plate to support a substrate within the substrate storage rack and on the ball member. Semiconductor processing systems and methods of making substrate storage racks are also described.

19 Claims, 15 Drawing Sheets

(56)                    References Cited

U.S. PATENT DOCUMENTS

| | | | |
|---|---|---|---|
| 6,092,955 | A | 7/2000 | Chartrain |
| 6,092,957 | A | 7/2000 | Fevre |
| 8,156,616 | B2 | 4/2012 | Lo |
| 8,440,048 | B2 * | 5/2013 | Aggarwal ............... C30B 25/16 |
| | | | 156/345.31 |
| 9,048,271 | B2 | 6/2015 | Oosterlaken |
| 9,349,620 | B2 | 5/2016 | Kamata |
| 9,773,400 | B1 | 9/2017 | Kim |
| 9,786,534 | B2 | 10/2017 | Nakamura |
| 9,818,634 | B2 | 11/2017 | Omori |
| 2003/0072639 | A1 * | 4/2003 | White ............... H01L 21/67309 |
| | | | 414/217 |
| 2006/0043722 | A1 | 3/2006 | Hoshino |
| 2006/0205213 | A1 * | 9/2006 | Ozaki ............... H01L 21/67309 |
| | | | 118/715 |
| 2007/0176059 | A1 | 8/2007 | Roscetti |
| 2009/0092468 | A1 * | 4/2009 | Oyama ............ H01L 21/67017 |
| | | | 414/222.01 |
| 2018/0182652 | A1 * | 6/2018 | Seshimo ........... H01L 21/67017 |
| 2019/0301020 | A1 * | 10/2019 | Nakaya ................... C23C 16/52 |

* cited by examiner

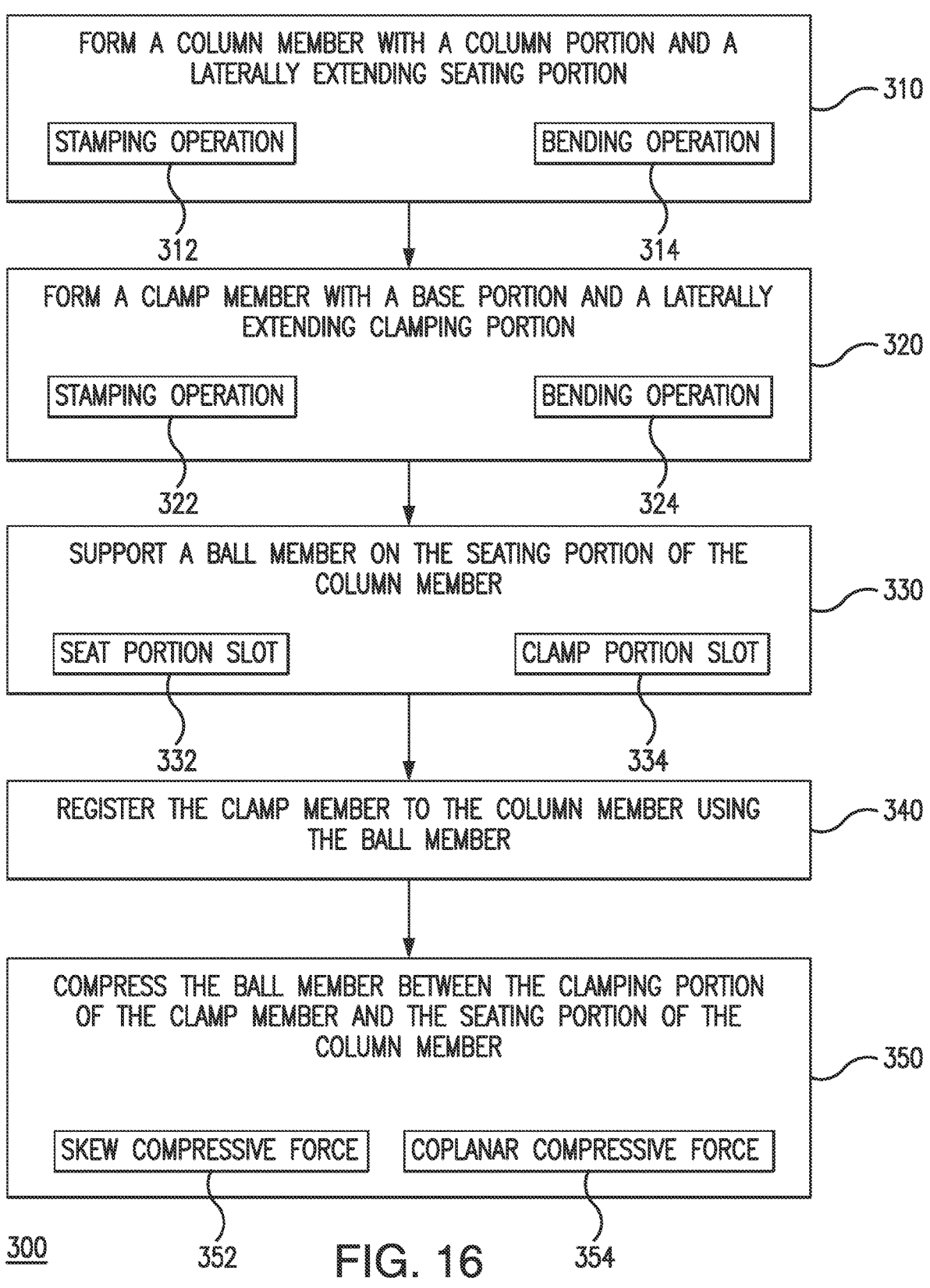

FORM A COLUMN MEMBER WITH A COLUMN PORTION AND A LATERALLY EXTENDING SEATING PORTION — 310

STAMPING OPERATION   312

BENDING OPERATION   314

FORM A CLAMP MEMBER WITH A BASE PORTION AND A LATERALLY EXTENDING CLAMPING PORTION — 320

STAMPING OPERATION   322

BENDING OPERATION   324

SUPPORT A BALL MEMBER ON THE SEATING PORTION OF THE COLUMN MEMBER — 330

SEAT PORTION SLOT   332

CLAMP PORTION SLOT   334

REGISTER THE CLAMP MEMBER TO THE COLUMN MEMBER USING THE BALL MEMBER — 340

COMPRESS THE BALL MEMBER BETWEEN THE CLAMPING PORTION OF THE CLAMP MEMBER AND THE SEATING PORTION OF THE COLUMN MEMBER — 350

SKEW COMPRESSIVE FORCE   352

COPLANAR COMPRESSIVE FORCE   354

SUBSTRATE STORAGE RACKS FOR SEMICONDUCTOR PROCESSING SYSTEMS

CROSS-REFERENCE TO RELATED APPLICATIONS

This application claims priority to U.S. Provisional Patent Application Ser. No. 63/276,918 filed Nov. 8, 2021 titled SUBSTRATE STORAGE RACKS FOR SEMICONDUCTOR PROCESSING SYSTEMS, the disclosure of which is hereby incorporated by reference in its entirety.

FIELD OF INVENTION

The present disclosure generally relates to fabricating semiconductor devices, and more particularly, to storing substrates during the fabrication of semiconductor devices, such as within semiconductor processing systems employed to deposit films onto substrates.

BACKGROUND OF THE DISCLOSURE

Semiconductor processing systems may include one or more process chambers that are adapted to carry out any number of processes, such as degassing, cleaning or pre-cleaning, deposition such as chemical vapor deposition (CVD), physical vapor deposition (PVD), or atomic layer deposition (ALD), coating, oxidation, nitration, etching (e.g., plasma etch), or the like. One or more load lock chambers may be provided to enable entry and exit of substrates from a factory interface. Each of these process chambers and load lock chambers may be included in a cluster tool, where a plurality of process chambers may be distributed about a transfer chamber, for example. A front-end transfer robot may be housed within the factory interface to transport a substrate (e.g., a silicon wafer, glass plate, or the like) between the factory interface and the load lock, and a back-end transfer robot may be housed within the transfer chamber to transport the substrate between the load lock and one or more of the process modules. Transport of the substrate may be accomplished by one or more end effectors (e.g., clamps or blades) carried by the front-end transfer robot and the back-end transfer robot, and position of the substrate within the process module may be according to a substrate centering sensor within the transfer chamber.

During processing, the front-end transfer robot retrieves substrates from a pod and transports the substrates through the factory interface to the load lock. From the load lock, substrates are transported through the transfer module by the back-end transfer robot to the process module, wherein the substrates are and processed according to the requirements of the particular semiconductor device being fabricated. Once processing is complete the substrates are retrieved from the process module by the transfer robot and again transported through the transfer module to the load lock. From the load lock, the processed substrates are transported by the front-end robot through the factory interface to pod, and thereafter removed from the semiconductor processing system to undergo further processing.

In some semiconductor processing systems, storage racks may be provided within the one or more of the factory interface, the load lock, and the transfer chamber to store substrates before and/or after processing. The storage racks may facilitate fabrication of semiconductor devices, for example, by providing storage space within the environment of the semiconductor processing system in proximity to resources that could otherwise constrain system throughput.

Such storage racks are typically include slotted rails milled from monolithic blocks of substrate-friendly materials, such as quartz or polyether ether ketone (PEEK), and suspended from backing plates for structural support. While generally acceptable for their intended purpose, the tolerances and machining time required to mill slots into such materials adds complexity and cost to the storage rack and the backing plates required to support quartz or PEEK slotted rails can interrupt the otherwise laminar airflow otherwise present within the internal environment of the semiconductor processing system.

Such methods and systems have generally been considered suitable for their intended purpose. However, there remains a need in the art for improved substrate storage racks, semiconductor processing systems having storage racks, and methods of making storage racks for semiconductor processing systems. The present disclosure provides a solution to this need.

SUMMARY OF THE DISCLOSURE

A substrate storage rack is provided. A substrate storage rack for a semiconductor processing system includes a bottom plate, a top plate, and a column assembly. The top plate is spaced apart from the bottom plate, the column assembly connects the top plate to the bottom plate, and a ball member is compressively seated within the column assembly. The ball member protrudes from the column assembly in a direction toward the top plate to support a substrate within the substrate storage rack and on the ball member.

In addition to one or more of the features described above, or as an alternative, further examples of the substrate storage rack may include that the ball member is formed from a ceramic material. The ball member may have a diameter that is about 4 millimeters.

In addition to one or more of the features described above, or as an alternative, further examples of the substrate storage rack may include that the column assembly is a first column assembly and that the substrate storage rack includes one or more second column assembly. The one or more second column assembly may connect the top plate to the bottom plate. The one or more second column assembly may be spaced apart from the first column assembly by between about 100 millimeters and about 300 millimeters. A shroud member may enclose each of the bottom plate, the top plate, the first column assembly, and the one or more second column assembly.

In addition to one or more of the features described above, or as an alternative, further examples of the substrate storage rack may include that the column assembly has a column member and a clamp member. The column member may have a column portion extending longitudinally between the base plate the and top plate and a seating portion extending laterally from the column portion. The clamp member may have a base portion extending longitudinally along the column portion of the column member and a clamping portion extending laterally from the base portion of the clamp member. The clamping portion of the clamp member may compressively fix the ball member against the seating portion and within a pocket defined between the seating portion of the column member and the clamping portion of the clamp member.

In addition to one or more of the features described above, or as an alternative, further examples of the substrate storage rack may include at least one of the seating portion of the column member and the clamping portion of the clamp member define a longitudinal slot with a rounded segment and a neck segment extending from the rounded segment. The rounded segment may have a diameter that is smaller than a diameter of the ball member. The ball member may be fixed within the rounded segment of the longitudinal slot.

In addition to one or more of the features described above, or as an alternative, further examples of the substrate storage rack may include that the seating portion of column member defines the longitudinal slot.

In addition to one or more of the features described above, or as an alternative, further examples of the substrate storage rack may include that the longitudinal slot is a first longitudinal slot defined by the seating portion of the column member, that the clamping portion of the clamp member defines a second longitudinal, and that the ball member is further fixed within the second longitudinal slot.

In addition to one or more of the features described above, or as an alternative, further examples of the substrate storage rack may include a spacer member. The spacer member may couple the clamp member to the column member. The spacer member may have a thickness, the ball member may have a diameter, and the thickness of the spacer member may be smaller than the diameter of the ball member.

In addition to one or more of the features described above, or as an alternative, further examples of the substrate storage rack may include that the column portion is a first column portion and the that the column member has a second column portion. The second column portion may extend in parallel with the first column portion. The second column portion may be connected to the first column member by the seating portion of the column member.

In addition to one or more of the features described above, or as an alternative, further examples of the substrate storage rack may include that the seating portion is a first seating portion and that the column member has one or more second seating portion. The one or more second seating portion may extend laterally from the column portion of the column member. The one or more second seating portion may be longitudinally spaced apart from the first seating portion along a longitudinal length of the column portion of the column member.

In addition to one or more of the features described above, or as an alternative, further examples of the substrate storage rack may include that the clamping portion of the clamp member is a first clamping portion and the clamp member has one or more second clamping portion. The one or more second clamping portion may be longitudinally spaced apart from the first clamping portion along a longitudinal length of the column portion of the column member.

In addition to one or more of the features described above, or as an alternative, further examples of the substrate storage rack may include that the clamp member is a first clamp member and that the column assembly includes one or more second clamp member. The one or more second clamp member may be connected to the column portion of the column member. The one or more second clamp member may be arranged longitudinally between the first clamp member and the top plate of the substrate storage rack.

In addition to one or more of the features described above, or as an alternative, further examples of the substrate storage rack may include that the ball member is a first ball member and that the column assembly includes one or more second ball member. The second ball member may be compressively seated within the column assembly. The one or more second ball member may protrude from the column assembly in a direction toward the top plate of the substrate storage rack. The one or more second ball member may be longitudinally spaced apart from the first ball member along a longitudinal length of the column portion of the column member.

In addition to one or more of the features described above, or as an alternative, further examples of the substrate storage rack may include that the column assembly includes a column member sheet body having column member sheet thickness and a clamp member sheet body having a clamp member sheet thickness. The column member sheet thickness of the column member sheet body may be greater than the clamp member sheet thickness of the clamp member sheet body.

In addition to one or more of the features described above, or as an alternative, further examples of the substrate storage rack may include that the column member sheet thickness is between about 1 millimeters and about 10 millimeters, and that the clamp member sheet thickness is between about 1 millimeter and about 10 millimeters.

A pod, e.g., front opening unified pod (FOUP), is provided. The pod includes an enclosure and a substrate storage rack as described above. The enclosure is arranged to be seated on a load port of a semiconductor processing system. The substrate storage rack is arranged within an interior of the enclosure.

A semiconductor processing system is provided. The semiconductor processing system includes a front-end module with a front-end transfer robot, a back-end module with a back-end transfer robot connected to the front-end module, a process module with heater or susceptor connected to the back-end module, and a substrate storage rack as described above. The substrate storage rack is arranged within a movement range of at least one of the front-end transfer robot and the back-end transfer robot. In certain examples, the substrate storage rack may be fixed relative to the front-end module. In accordance with certain examples, the substrate storage rack may be movable relative to the front-end module. It is also contemplated that the substrate storage rack may be movable relative to the semiconductor processing system, such as using an automated material handling system.

In addition to one or more of the features described above, or as an alternative, further examples of the semiconductor processing system may include that the front-end module comprises a notch aligner, and that the substrate storage rack is arranged above the notch aligner and within the front-end module.

In addition to one or more of the features described above, or as an alternative, further examples of the semiconductor processing system may include that the semiconductor processing system includes a load lock, and that the substrate storage rack is arranged within the load lock.

A method of making a substrate storage rack is provided. The method includes forming a column member with a column member and a seating portion using a column member sheet body, the seating member extending laterally from the column portion of the column member. A clamp member with a base portion and a clamping portion extending laterally from the base portion is formed using a clamp member sheet body. A ball member is seated on the seating portion of the column member, the clamp member is registered to the column member using the ball member, and the ball member is compressed between the seating portion of the column member and clamping portion of the clamp member. The ball member is fixed in compression between the seating portion of the column member and the clamping portion of the clamp member by fastening the base portion of the clamp member to the column portion of the column member.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
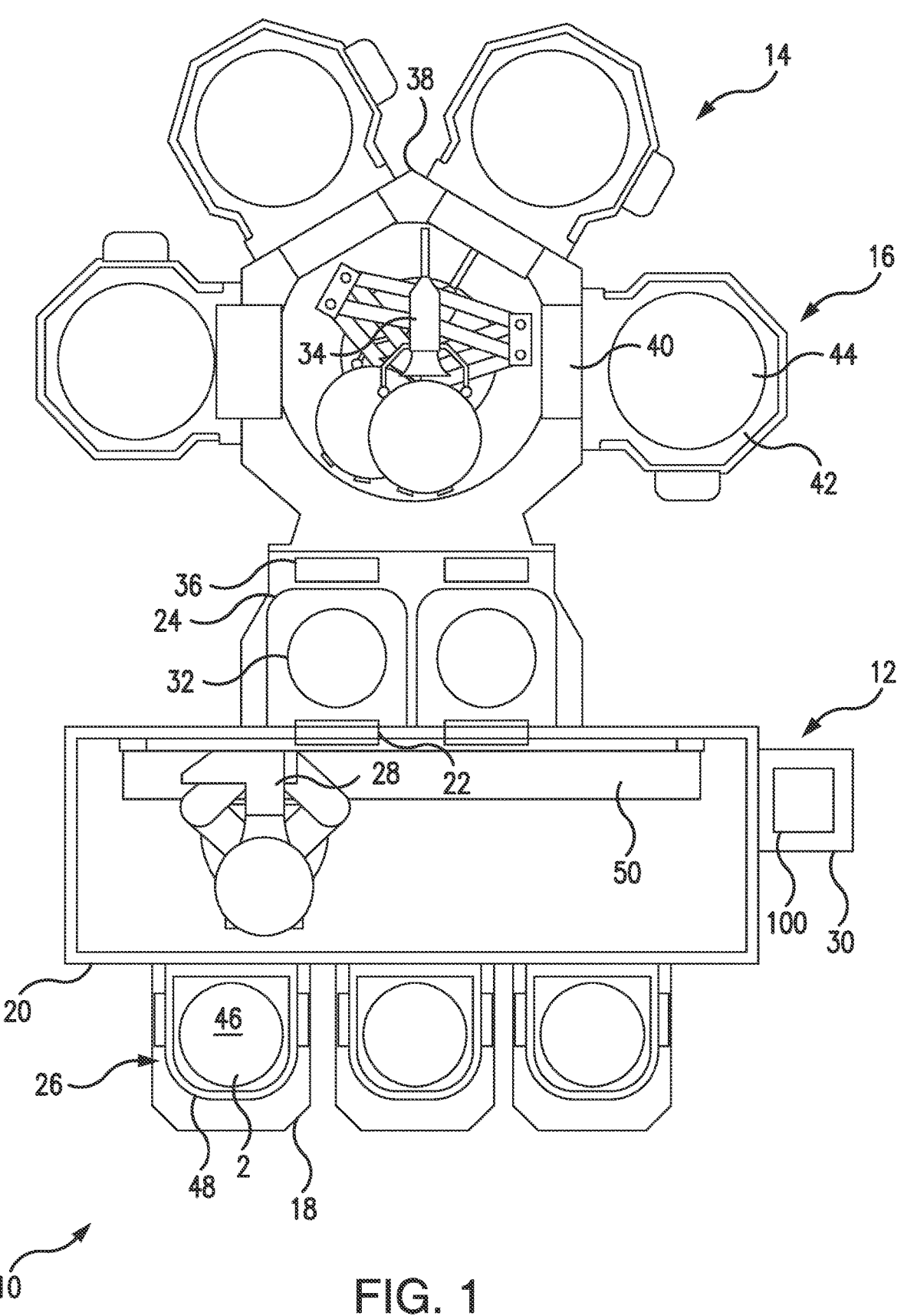
FIG. 1 is a schematic view of a semiconductor processing system with a substrate storage rack in accordance with the present disclosure, showing the substrate storage rack arranged above a notch aligner and within a front-end module chamber of the semiconductor processing system.
Figure 13:
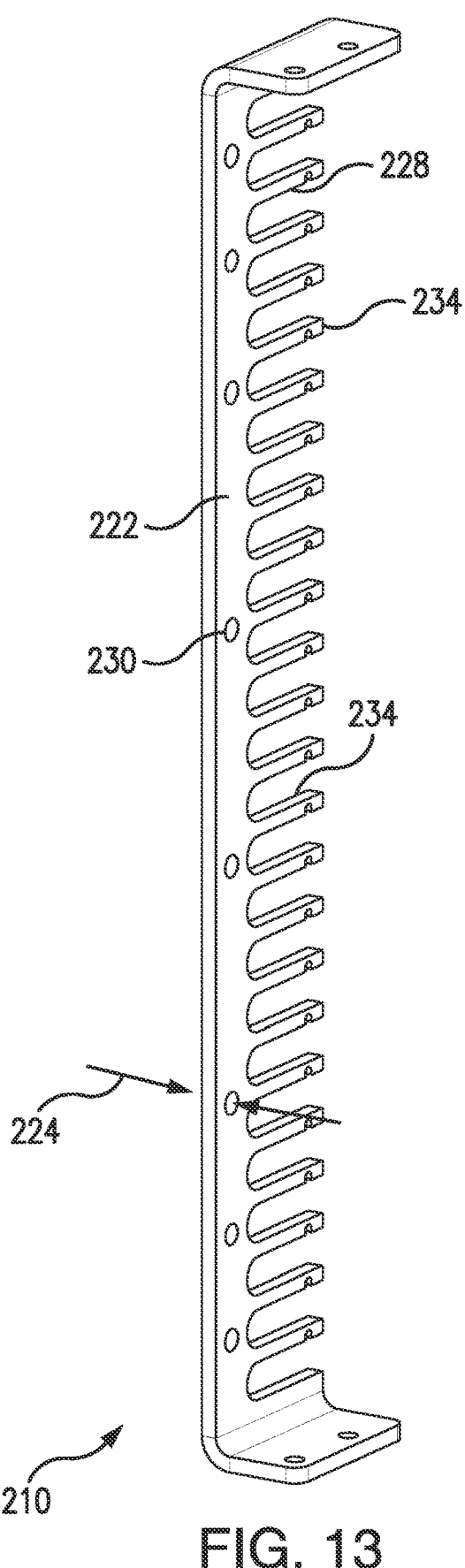
Figure 14:
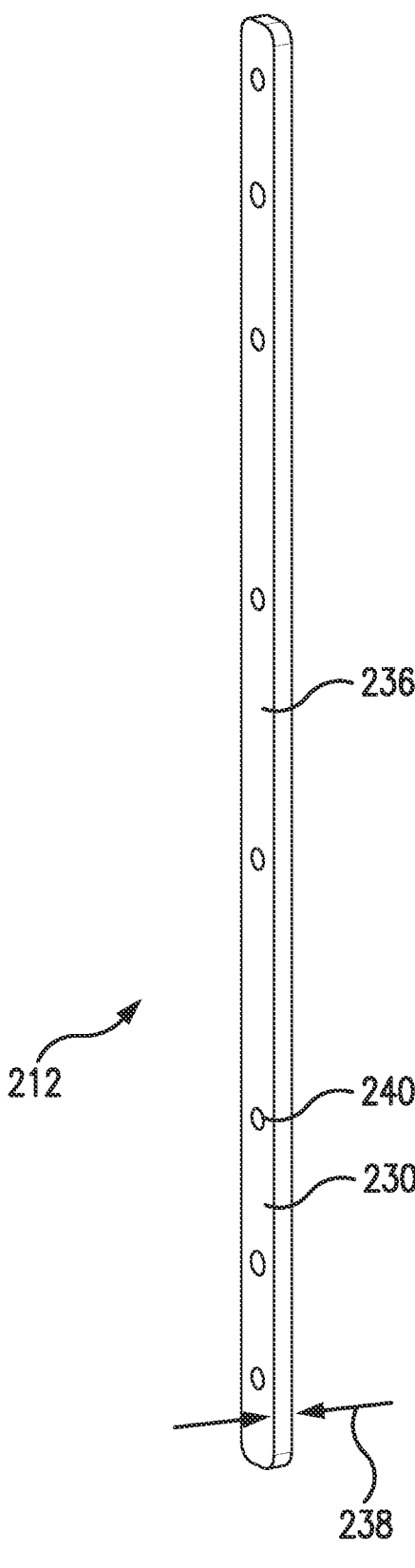
Figure 15:
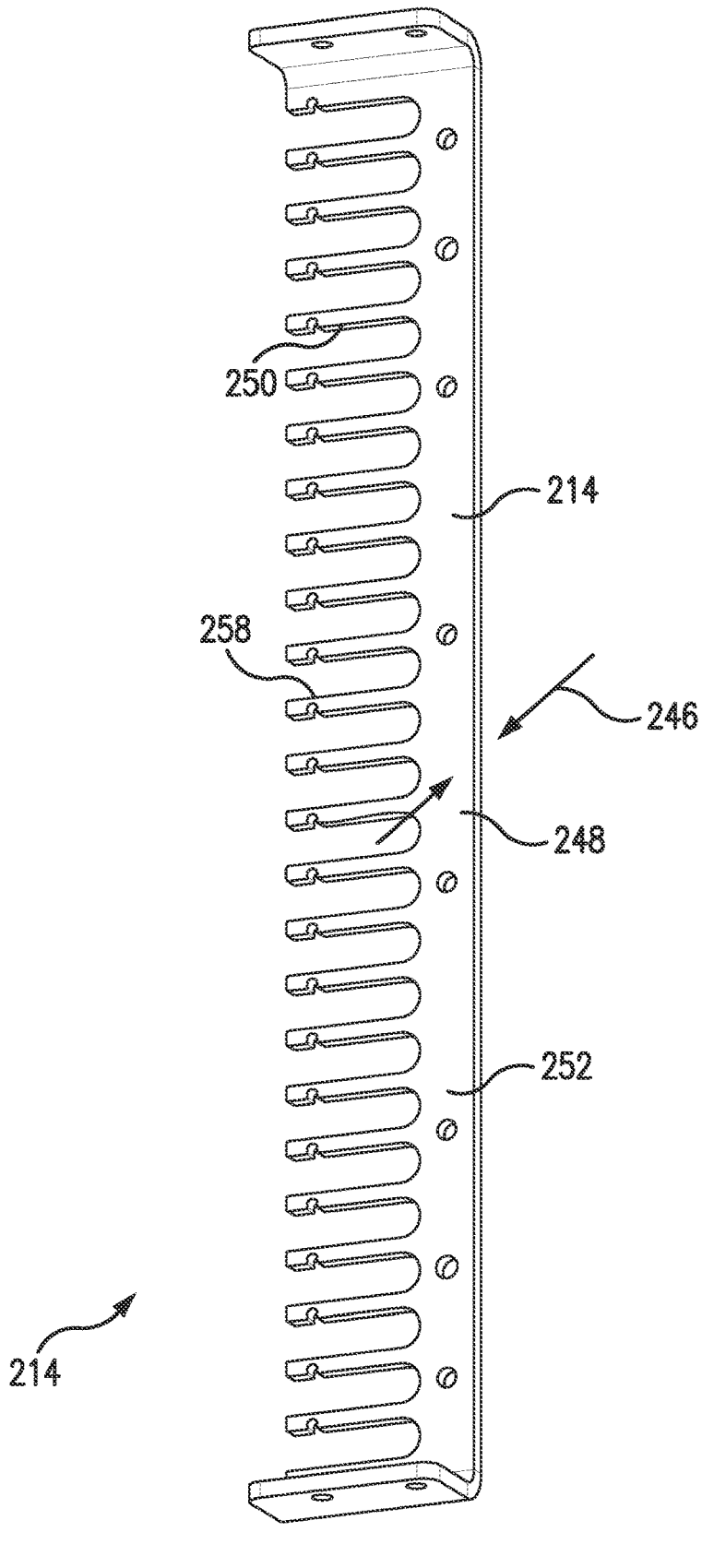

FIGS. 13-15 are plan views of components of the substrate storage assembly of FIG. 1 according to the second example, showing the clamp member, the spacer member, and the column member subsequent to stamping each member; and FIG. 16 is a block diagram of a method making a substrate storage rack in accordance with the present disclosure, showing operations according to an illustrative and non-limiting example of the method.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of an example of a substrate storage rack in accordance with the present disclosure is shown in FIG. 1 and is designated generally by reference character 100. Other examples of substrate storage racks, semiconductor processing systems, and methods of making substrate storage racks, or aspects thereof, are provided in FIGS. 2-16, as will be described. The substrate storage racks of the present disclosure may be used to store substrates during the fabrication of semiconductor devices, such as proximate to notch aligners or load locks in cluster-type semiconductor processing systems employed to deposit films onto substrates, though the present disclosure is not limited to any particular location or to semiconductor processing systems employed to deposit films onto substrates in general.

As used herein, a "substrate" refers to any material having a surface onto which material can be deposited. A substrate may include a bulk material such as silicon (e.g., single crystal silicon) or may include one or more layers overlaying the bulk material. Further, a substrate may include various topologies, such as trenches, vias, lines, and the like formed within or on at least a portion of a layer of the substrate. A substrate may include silicon wafer, such as a 200-millimeter silicon wafer, a 300-millimeter silicon wafer, or even a 450-millimeter silicon wafer.

Referring to FIG. 1, a semiconductor processing system 10 is shown. The semiconductor processing system 10 includes a front-end module 12, a back-end module 14, and a process module 16. The front-end module 12 includes a load port 18, a front-end enclosure 20, a front-end gate valve 22, a load lock 24, and the substrate storage rack 100. The load port 18 is configured to seat thereon a pod 26, e.g., a front-opening unified pod (FOUP) containing a substrate 2, to move substrates to and from the semiconductor processing system 10. The front-end enclosure 20 is connected to the load port 18 and houses a front-end transfer robot 28, a notch aligner 30, and the substrate storage rack 100. The front-end transfer robot 28 is supported for movement within the front-end enclosure 20, has a movement envelope including the substrate storage rack 100, and is configured to transport substrates, e.g., the substrate 2, between the load port 18 and the load lock 24 using the substrate storage rack 100. The notch aligner 30 is supported within the front-end enclosure 20 and is configured to notch-align substrates; e.g., imparting one or more of a predetermined x-shift, y-shift, and rotation in the substrate; within the front-end enclosure 20. The front-end gate valve 22 is connected to the front-end enclosure 20, couples the front-end enclosure 20 to the load lock 24, and is configured to provide selective communication between the front-end enclosure 20 and the load lock 24. The load lock 24 is connected to the front-end gate valve 22, and therethrough to the front-end enclosure 20, and may include a chill plate 32 and/or a park station. Although shown and described herein as having three (3) load ports and two (2) load locks, it is to be understood and appreciated that the semiconductor processing system 10 may have fewer or additional load ports and load locks and remain within the scope of the present disclosure.

The back-end module 14 is connected to the front-end module 12 and includes the back-end transfer robot 34, a back-end gate valve 36, and a back-end chamber 38. The back-end gate valve 36 is connected to the load lock 24 and is configured to provide selective communication between the load lock 24 and the back-end chamber 38. The back-end chamber 38 is connected to the back-end gate valve 36 and houses the back-end transfer robot 34. The back-end transfer robot 34 is supported within the back-end chamber 38 for movement relative to the load lock 24, has a movement envelope encompassing both the load lock 24 and the process module 16, and is configured to transport substrates, e.g., the substrate 2, between the load lock 24 and the process module 16. Although shown and described herein as having a singular back-end module, it is to be understood and appreciated that the semiconductor processing system 10 may have more than one back-end module and remain within the scope of the present disclosure.

The process module 16 includes a process module gate valve 40, a reaction chamber 42, and a susceptor or heater 44. The process module gate valve 40 is connected to the back-end module 14, couples the back-end chamber 38 to the reaction chamber 42, and is configured to provide selective communication between the back-end module 14 and the process module 16. The reaction chamber 42 is connected to the back-end chamber 38 and houses the susceptor or heater 44. The susceptor or heater 44 is supported within the reaction chamber 42 and is configured to support substrates, e.g., the substrate 2, during processing of the substrates. In certain examples the susceptor or heater 44 may be configured to support the substrate 2 during deposition of a film onto the substrate 2. In accordance with certain examples, the susceptor of heater 44 may be configured to support the substrate 2 during removal of a film from the surface of the substrate 2. Although shown and described herein in the context of a semiconductor processing system configured for depositing films onto substrates, it is to be understood and appreciated that semiconductor processing systems configured for performing other processing operations may also benefit from the present disclosure. Further, it is to be understood and appreciated that semiconductor processing systems having fewer or additional process modules, as well as process modules including more than one reaction chamber, may also benefit from the present disclosure.

In certain examples, the substrate storage rack 100 may be supported within the front-end module 12 and/or within a movement range 50 of the front-end transfer robot 28. In this respect the substrate storage rack 100 may be supported within the front-end enclosure 20 and above the notch aligner 30. So positioned, the substrate storage rack 100 enables staging substrates in proximity to the notch aligner 30, improving throughput in processes where notch alignment could otherwise constrain throughput. Alternatively (or additionally), the substrate storage rack 100 may be supported within the load lock 24, for example and above the chill plate 32. Positioning the substrate storage rack 100 within the load lock 24 enables staging substrates in proximity to the chill plate 32, improving throughput in processes where substrate cooling could otherwise constrain throughput. It is also contemplated that, in accordance with certain examples, the substrate storage rack 100 may be arranged within an interior 46 of an enclosure 48 employed to transfer substrates to and from the semiconductor processing system 10, e.g., the pod 26. As will be appreciated by those of skill in the art in view of the present disclosure, this can limit particle generation due to the point support regime employed within the substrate storage rack 100.

Figure 2:
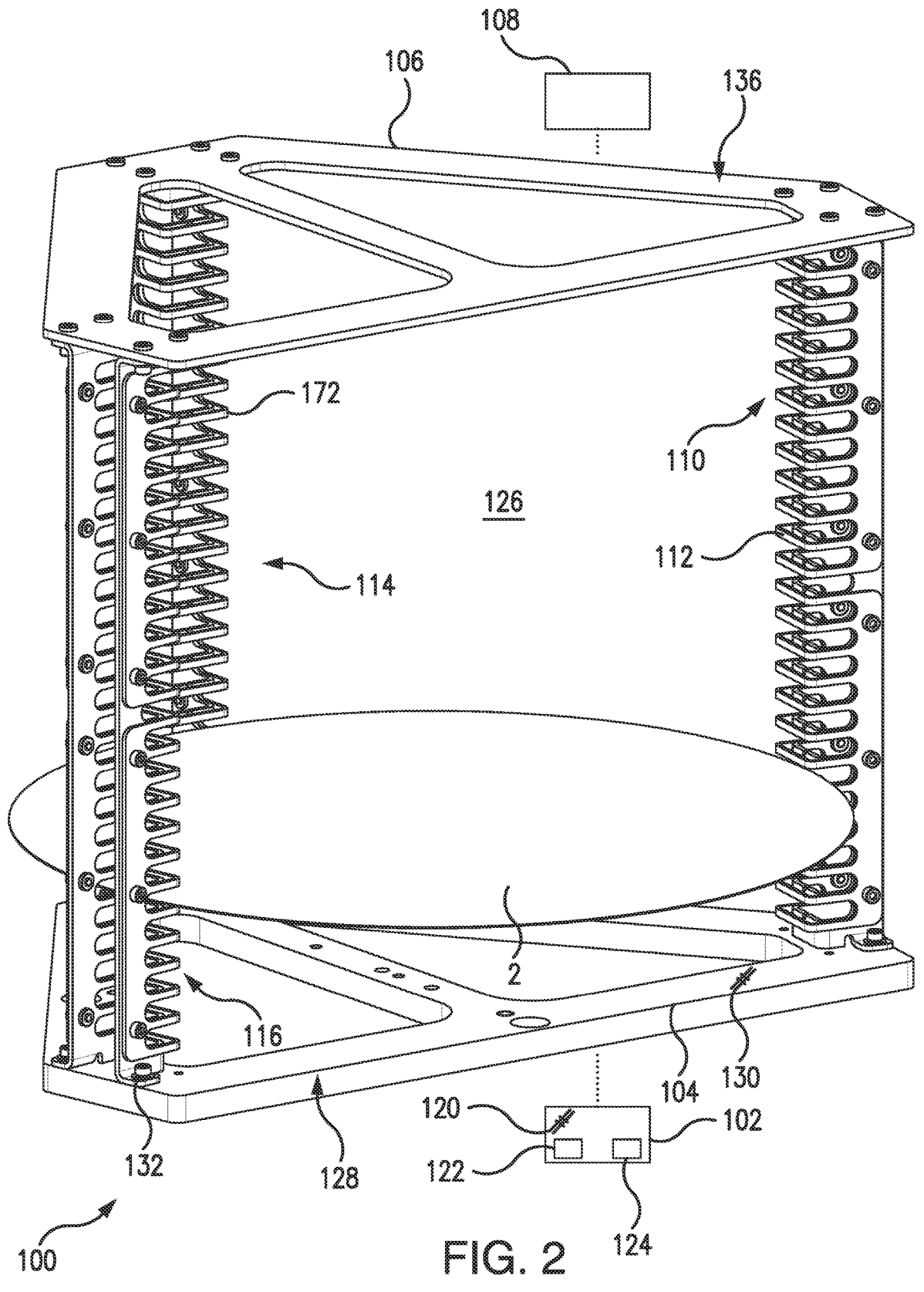
FIG. 2 is a perspective view of the substrate storage rack of FIG. 1 according to a first example, showing column assemblies connecting a top plate to a bottom plate within shroud to support substrates within slots defined by the column assemblies on ball members fixed within the column assembly.

With reference to FIG. 2, the substrate storage rack 100 is shown. The substrate storage rack 100 includes a base plate 102, a bottom plate 104, a top plate 106, and a shroud 108. The substrate storage rack 100 also includes a column assembly 110 defining one or more slot 112 configured to seat a substrate, e.g., the substrate 2, within the one or more slot 112. In illustrated example the column assembly 110 is first column assembly 110 and the substrate storage rack 100 includes a second column assembly 114 and a third column assembly 116. The second column assembly 114 is similar to the first column assembly 110, extends in parallel with the first column assembly 110, and is offset from the first column assembly 110. The third column assembly 116 is also similar to the first column assembly 110, further extends in parallel with the first column assembly 110 and is further offset from both the first column assembly 110 and the second column assembly 114. In certain examples, the second column assembly 114 may be separated from the first column assembly 110 by less than about 300 millimeters. In accordance with certain examples, one or more of the second column assembly 114 and the third column assembly 116 is offset from the first column assembly 110 by about 90 degrees from a center of the substrate 2. Although shown and described herein area having three column assemblies, it is to be understood and appreciated that the substrate storage rack 100 may have fewer or additional column assemblies and remain within the scope of the present disclosure.

The base plate 102 includes a base plate body 118. The base plate body 118 may be formed from a metallic material 120, has a base plate fastener pattern 122, and defines a base plate aperture 124. The metallic material 120 may include an aluminum-containing or stainless-steel material, such as 4040 aluminum or 304 stainless steel, which simplifies fabrication of the substrate storage rack 100 by eliminating the need to coat or paint the substrate storage rack 100. The base plate fastener pattern 122 is configured to both connect the substrate storage rack 100 to the semiconductor processing system 10 (shown in FIG. 1) and the bottom plate 104 to the base plate body 118. The base plate aperture 124 extends through the base plate body 118, couples upper surface of the base plate body 118 to the a lower surface of the base plate body 118, and is configured to provide fluid communication between an interior 126 of the substrate storage rack 100 and interior of the semiconductor processing system 10. In the illustrated example the base plate 102 is configured to support the substrate storage rack 100 within the front-end enclosure 20 of the front-end module 12 at a location above the notch aligner 30 (shown in FIG. 1). As will be appreciated by those of skill in the art in view of the present disclosure, support of the substrate storage rack 100 in proximity to the notch aligner 30 provides capability to store substrates, e.g., the substrate 2, in proximity to the notch aligner 30, limiting the tendency of the notch aligner 30 to constrain throughput in processes that require rotationally aligning substrates prior to transporting substrates to the process module 16.

The bottom plate 104 includes a bottom plate body 128. The bottom plate body 128 may be formed from a metallic material 130, has a bottom plate fastener pattern 132, and defines a bottom plate aperture 134. The metallic material 130 may include an aluminum-containing or stainless-steel material such as 4040 aluminum or 304 stainless steel. The bottom plate fastener pattern 132 connects each of first column assembly 110, the second column assembly 114, and the third column assembly 116 to the bottom plate body 128. The bottom plate aperture 134 overlaps the base plate aperture 124 and fluidly couples the interior 126 of the substrate storage rack 100 to the base plate aperture 124.

The top plate 106 includes a top plate body 136. The top plate body 136 may formed from a metallic material 138, has a top plate fastener pattern 140, and defines a top plate aperture 142. The metallic material 138 may include an aluminum-containing or stainless-steel material such as 4040 aluminum or 304 stainless steel. The top plate fastener pattern 140 connects the top plate body 136 to each of the first column assembly 110, the second column assembly 114, and the third column assembly 116, and therethrough to the bottom plate 104. The top plate aperture 142 is fluidly coupled to the interior 126 of the substrate storage rack 100, and therethrough to the bottom plate aperture 134.

The shroud 108 includes a shroud body 144. The shroud body 144 may be formed from a metallic material 146, bounds the interior 126 of the substrate storage rack 100, and has an inlet 148 and an outlet 150. The metallic material 146 may include an aluminum-containing or stainless-steel material such as 4040 aluminum or 304 stainless steel. The inlet 148 is separated from the second column assembly 114 and the third column assembly 116 by the first column assembly 110. The outlet 150 is separated from the first column assembly 110 by the second column assembly 114 and the third column assembly 116. It contemplated that the inlet 148 be fluidly coupled to a fan-filter unit supported within an upper recess of the front-end module 12, that the outlet 150 be fluidly coupled to an interior of the front-end enclosure 20, and that shroud 108 be configured to flow filtered air from the inlet 148 to the outlet 150 and across a substrate, e.g., the substrate 2 (shown in FIG. 1), seated within the one or more slot 112 while stored within the substrate storage rack 100.

Figure 3:
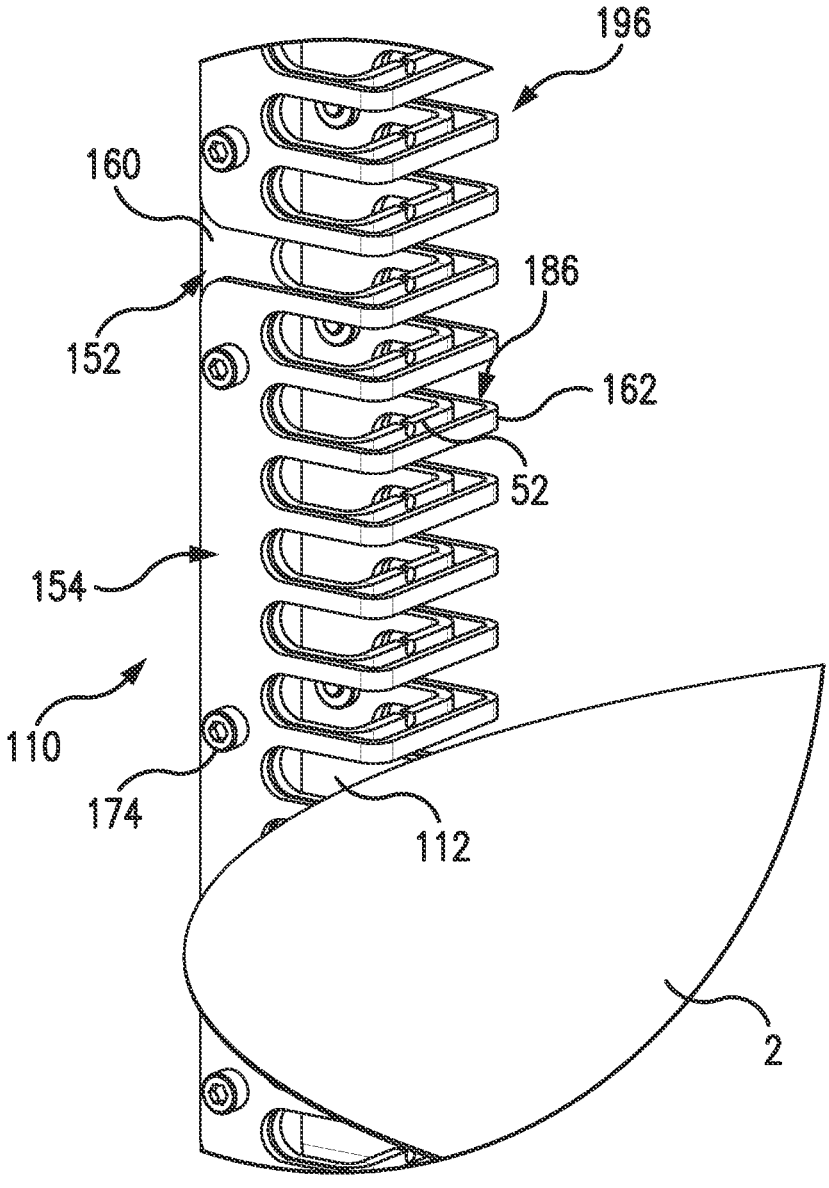
FIG. 3 is a perspective view of a portion of the substrate storage rack of FIG. 1 according to the first example, showing ball members fixed between seating portions of a column member and clamping portions of clamp members by radial clamping forces to support substrates on the column assembly.

With reference to FIG. 3, the first column assembly 110 includes a column member 152, a clamp member 154, and a ball member 156. The column member 152 includes a column member sheet body 158 (shown in FIG. 5) having a column portion 160 and a seating portion 162 (shown in FIG. 5). The column member sheet body 158 may be formed from metallic sheet material 164 (shown in FIG. 5) such as 4040 aluminum or 304 stainless steel and has a thickness 166 (shown in FIG. 6). The thickness 166 may be between about 1 millimeter and about 10 millimeters, or between about 2 millimeters about 8 millimeters, or even between about 3 millimeters and about 6 millimeters. In certain examples, the thickness 166 may be about 2 millimeters. As will be appreciated by those of skill in the art in view of the present disclosure, thicknesses within these ranges allow the column member 152 to be formed from planar sheet stock using a stamping and succeeding bending operation. This simplifies fabrication of the column assembly 110 as it eliminates the need to machine slots into quartz or polyether ether ketone (PEEK) bar stock material, and thereafter support the slotted body on a structural member, simplifying fabrication of the substrate storage rack 100 (shown in FIG. 1).

Figure 4:
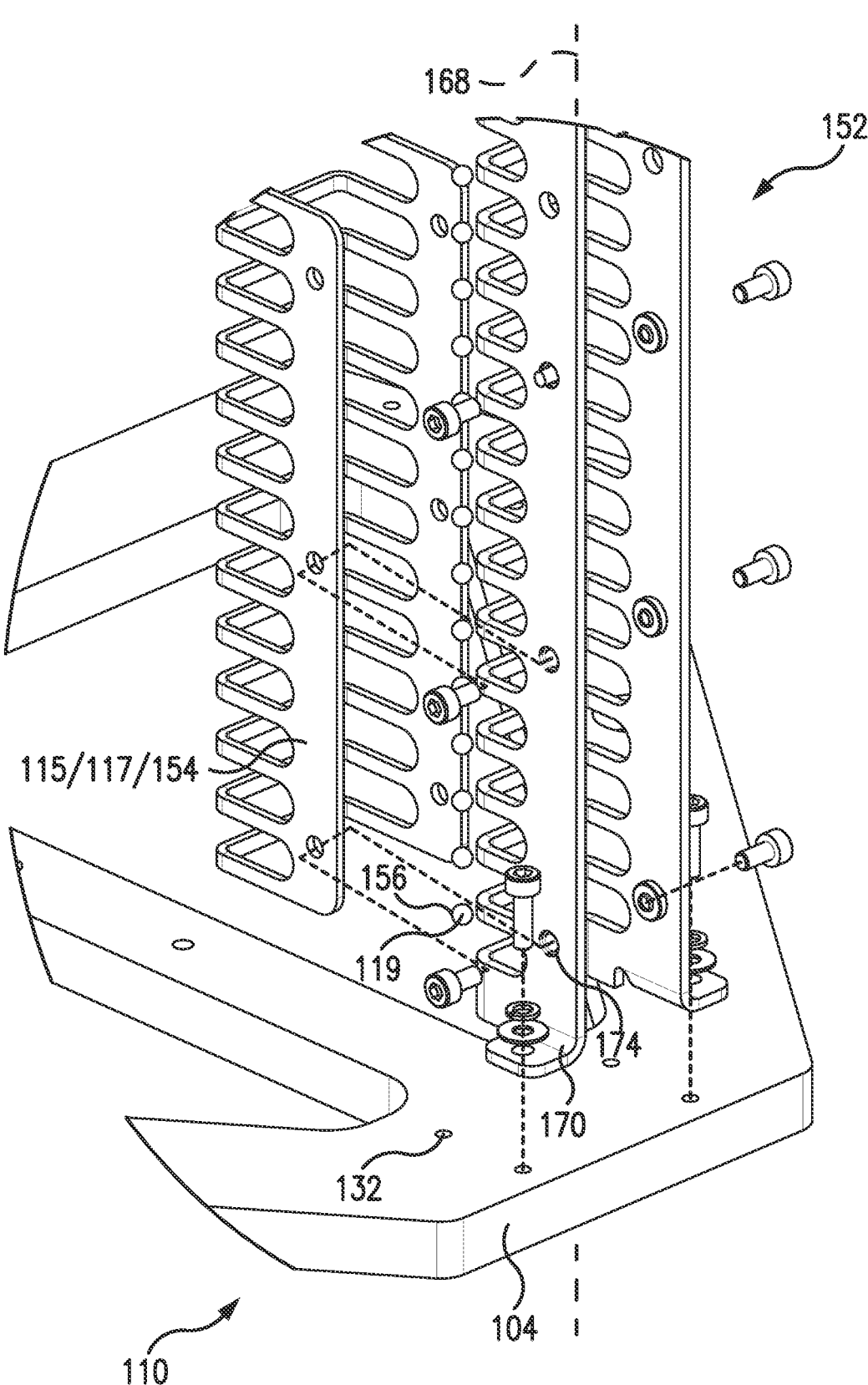
FIG. 4 is an exploded view of a portion of the substrate storage rack of FIG. 1 according to the first example, showing three clamp members and ball members exploded away from the column member of the column assembly.

With reference to FIG. 4, the column portion 160 of the column member 152 defines a column member axis 168 and has bottom fastener tab 170, a top fastener tab 172, and one or more fastener aperture 174. The bottom fastener tab 170 extends laterally from the column portion 160 and is configured to connect the column member 152 to the bottom plate 104 using the bottom plate fastener pattern 132. The top fastener tab 172 extends laterally from the column portion 160 at an end opposite the bottom fastener tab 170 and is configured to connect the column member 152 to the top plate 106 using the top plate fastener pattern 140. The one or more fastener aperture 174 extends through the column portion 160 at a location longitudinally between the bottom fastener tab 170 and the top fastener tab 172 and is configured to couple the clamp member 154 to the column member 152.

In certain examples, the column portion 160 of the column member 152 may define a plurality of fastener apertures 174 extending through the column member sheet body 158. In such examples, the plurality of fastener apertures 174 may connect a singular clamp member 154 to the column member 152, increasing stiffness of the column assembly 110. In accordance with certain examples, the clamp member 154 may be a first clamp member 154 and the plurality of fastener apertures 174 may connect at one second clamp member 176 to the column member 152, increasing the number of substrates that may be stored in the substrate storage rack 100. It is contemplated that one or more of the top fastener tab 172 and the bottom fastener tab 170 may be portions of the column member 152, such as formed using a pressing or bending application, such as with a press brake. It is also contemplated that one or more of the top fastener tab 172 and the bottom fastener tab 170 may be fastened to the column member 152. As will be appreciated by those of skill in the art in view of the present disclosure, employment of fastened tabs can simplify fabrication of the column assembly 110 by limiting (or eliminating) the tolerance consequences of forming either (or both) the top fastener tab 172 and or the bottom fastener tab 170 using a pressing or bending operation.

Figure 5:
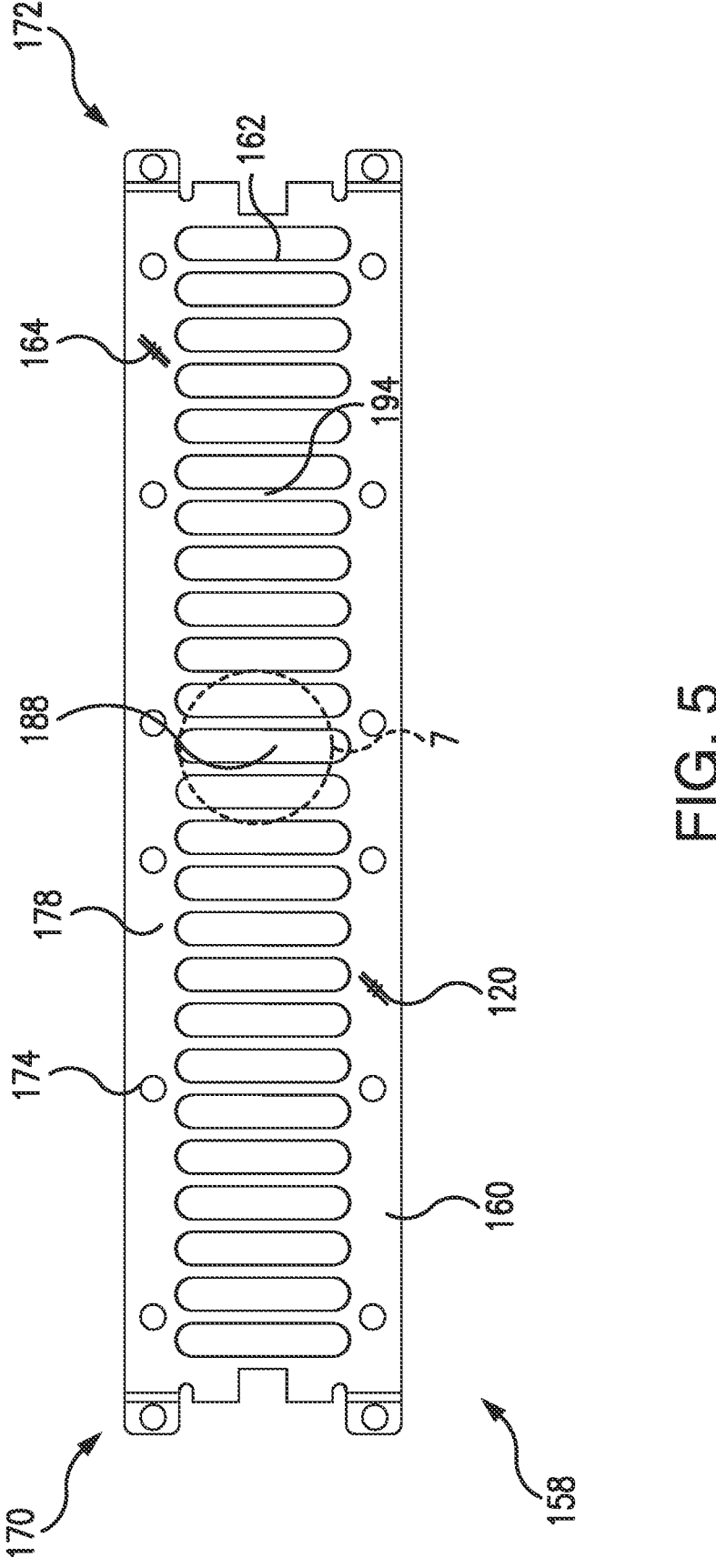
FIGS. 5-9 are plan and perspective views of components the substrate assembly of FIG. 1 according to the first example, showing the ball member, the column member subsequent to stamping and subsequent to bending during fabrication, and the clamp member subsequent to stamping and subsequent to bending during fabrication.
Figure 6:
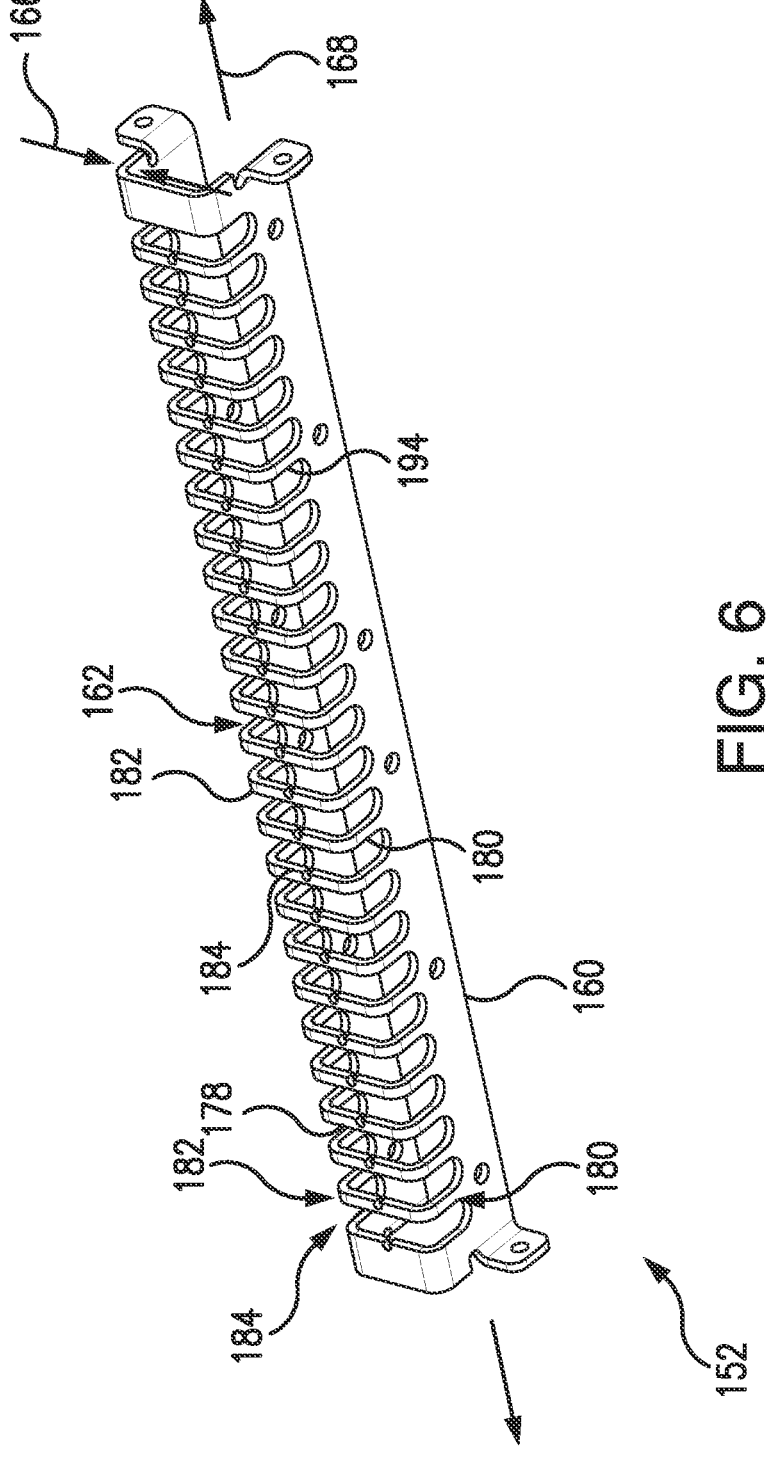

With reference to FIGS. 5 and 6, the column portion 160 may be a first column portion 160 and the column member 152 may have a second column portion 178. In such examples the second column portion 178 may be similar to the first column portion 160 and is additionally arranged on a side of the column member axis 168 opposite the first column portion 160. It is contemplated that second column portion 178 be connected to the first column portion 160 by the seating portion 162. The seating portion 162 may have a first lateral segment 180 extending laterally from the first column portion 160 of the column member 152, a second lateral segment 182 extending laterally from the second column portion 178 of the column member 152, and an arcuate segment 184 spanning the column member axis 168 and connecting the first lateral segment 180 to the second lateral segment 182.

It is contemplated that the ball member 156 (shown in FIG. 3) be seated on the seating portion 162 of the column member 152. In this respect the clamp member 154 and the seating portion 162 of the column member 152 define a pocket 186 between one another, the ball member 156 is at least partially captive within the pocket 186, and a protruding portion 196 of the ball member 156 protrudes from the pocket 186. In further respect, the seating portion 162 of the clamp member 154 (shown in FIG. 3) may laterally overlay both the ball member 156 and the arcuate segment 184 of the seating portion 162 to exert a radial clamping force 52

(shown in FIG. 3) on the ball member 156, i.e., exerted along an axis intersecting the center of a circular substrate positioning within the substrate storage rack 100, the radial clamping force 52 fixing the ball member 156 within column assembly 110.

Figure 7:
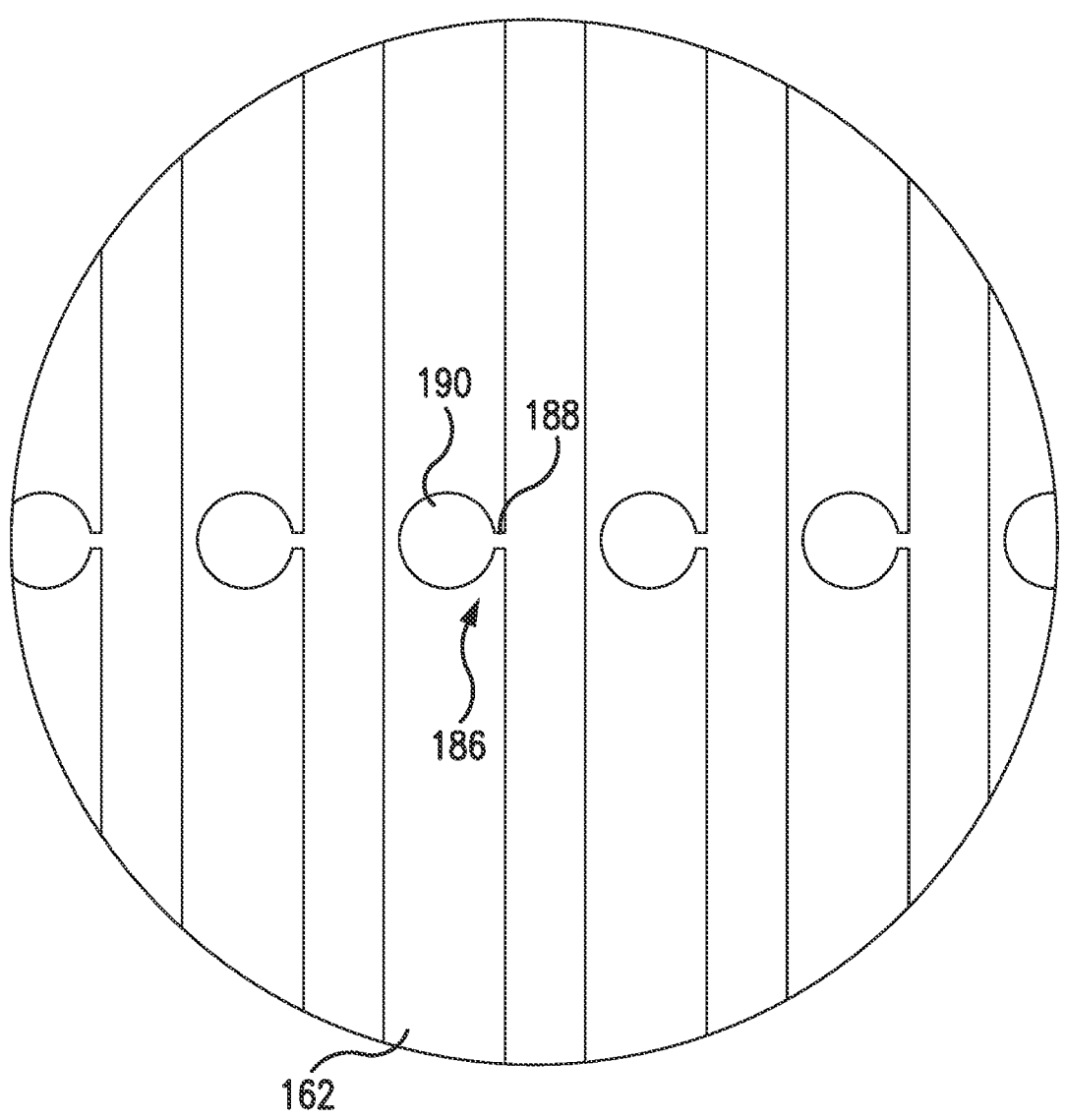

With reference to FIG. 7, at least one of the arcuate segment 184 and the clamp member 154 may define a longitudinal slot 188 within the pocket 186. In such examples the ball member 156 (shown in FIG. 3) may be captive within the pocket 186 between the arcuate segment 184 and the clamp member 154 at a position defined by the geometry of the longitudinal slot 188. For example, the longitudinal slot 188 may include a neck segment 190 and a rounded segment 192. The neck segment 190 may extend upwards from the rounded segment 192 and have a width that is smaller than a diameter of the rounded segment 192. The rounded segment 189 may have a diameter that is smaller than a diameter the ball member 156. As will be appreciated by those of skill in the art in view of the present disclosure, sizing the rounded segment 192 of the longitudinal slot 188 with a diameter that is less than the diameter of the ball member 156 can simplify fabrication of the column assembly 110 (shown in FIG. 2). In this respect the rounded segment 192 of the longitudinal slot 188 may register the ball member 156 relative to the seating portion 162 of the column member 152. The rounded segment 192 may further retain position of the ball member 156 during assembly of the clamp member 154 onto the column member 152, limiting (or eliminating) the need for a specialized jig to otherwise support the ball member 156 during the assembly process. The longitudinal slot 188 may be formed using a stamping operation, a punching operation, or a broaching operation. For example, a relatively low-cost push or pull operation may be employed to form the longitudinal slot 188 instead of a more complex and/or costly rotary broaching operation.

With continuing reference to FIGS. 5 and 6, the seating portion 162 may be a first seating portion 162 and the column member 152 may have one or more second seating portion 194. In such examples the second seating portion 194 may be similar to the first seating portion 162 and additionally offset longitudinally from the first seating portion 162 along the column member 152 by a height of the one or more slot 112 (shown in FIG. 3). In this respect the height of the one or more slot 112 may be defined between a contact point on a protruding portion 196 (shown in FIG. 3) of the ball member 156 extending upwards from the pocket 186, the protruding portion 196 above both the seating portion 162 of the column member 152 and a clamping portion 198 of the clamp member 154. The height of the one or more slot 112 may be between about 1 millimeter and about 10 millimeters, or between 2 millimeters and about 9 millimeters, or between about 4 millimeters and about 8 millimeters. In certain examples, the height of the one or more slot 112 may be about 6 millimeters. As will be appreciated by those of skill in the art in view of the present disclosure, heights within these ranges allow an end effector of the front-end transfer robot 28 (shown in FIG. 1) to move upwards and downwards within the interior 126 of the substrate storage rack 100 to place and retrieve substrates, e.g., the substrate 2 (shown in FIG. 1), in the one or more slot 112. In the illustrated example the column member 152 has 30 seating portions longitudinally spaced apart from one another along the length of the column member 152. As will also be appreciated by those of skill in the art in view of the present disclosure, the column member 152 may have fewer or additional seating portions than shown in the illustrated example and remain within the scope of the present disclosure.

Figure 8:
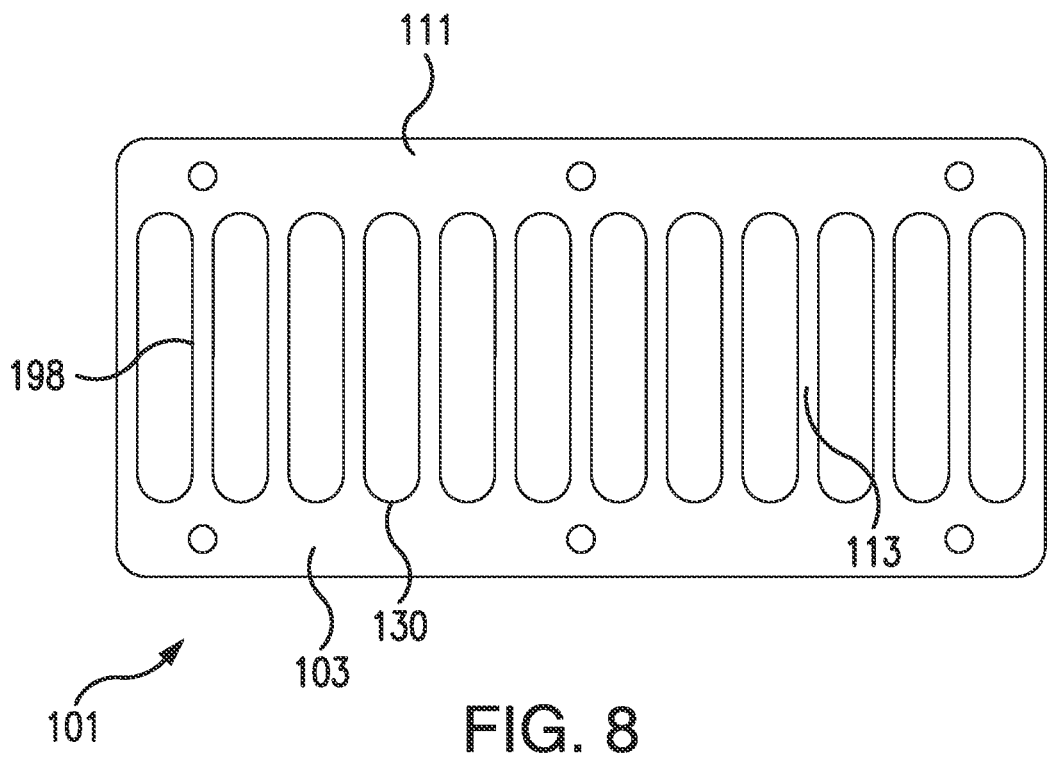
Figure 9:
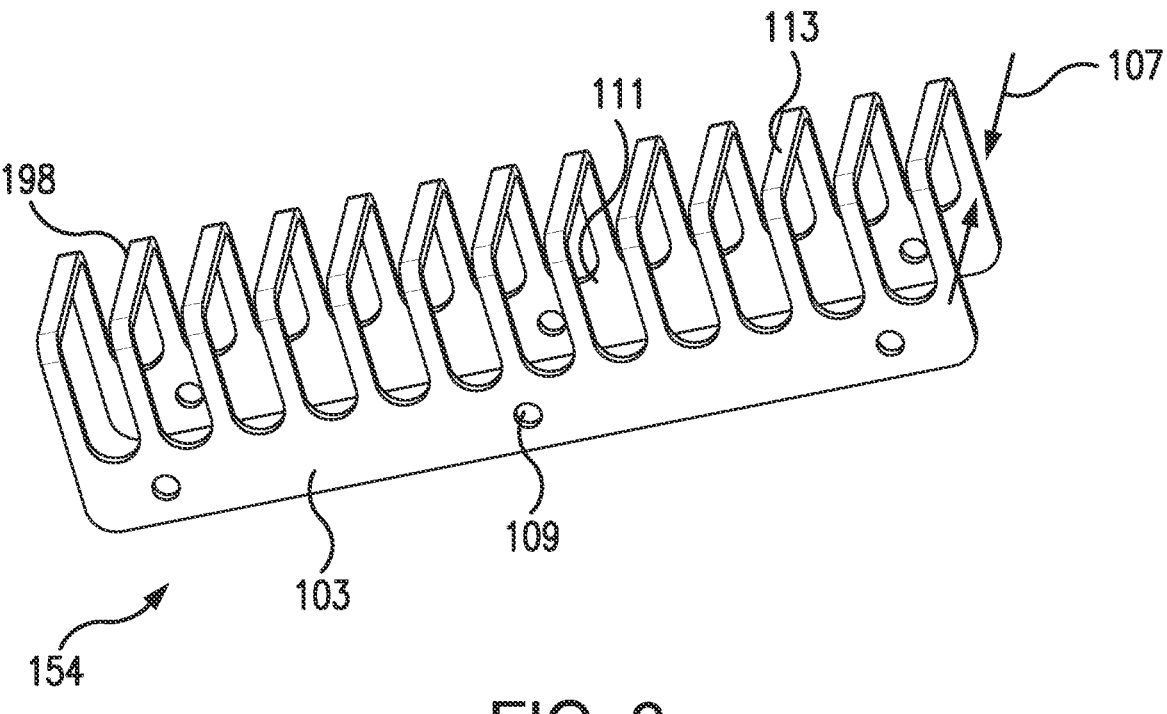

With reference to FIGS. 8 and 9, the clamp member 154 includes a clamp member sheet body 101 with the clamping portion 198 and a base portion 103. The clamp member sheet body 101 is formed from metallic sheet material 105 and has a thickness 107. The metallic sheet material 105 may include an aluminum-containing or stainless-steel material, such as 4040 aluminum or 304 stainless steel. In certain examples, the thickness 107 of the clamp member sheet body 101 may be between about 1 millimeter and about 10 millimeters, or between about 1 millimeter about 6 millimeters, or even between about 1 millimeter and about 2 millimeters. In accordance with certain examples, the thickness 107 may be about 1.5 millimeters. As will be appreciated by those of skill in the art in view of the present disclosure, thicknesses within these ranges also allow the clamp member 154 to be formed from planar sheet stock using a stamping and a subsequent bending operation. Forming the clamp member 154 using stamping and bending operations can simplify fabrication of the column assembly 110, for example, by eliminating machining operations otherwise required to defines slots into bar stock formed from a material suitable for substrate contact, such as quartz or PEEK stock.

In certain examples, the base portion 103 of the clamp member 154 may extend in parallel with the first column portion 160 of the column member 152. In accordance with certain examples, the base portion 103 of the clamp member 154 may be spaced apart from the column member axis 168 (shown in FIG. 4) by the first column portion 160 (shown in FIG. 5) of the column member 152 (shown in FIG. 3). It is also contemplated that the clamp member 154 may have one or more fastener aperture 109 Shown in FIG. 5), and that the base portion 103 of the clamp member 154 may be connected to the first column portion 160 by one or more fastener received in the fastener aperture 109 of the base portion 103 and the one or more fastener aperture 174 of the first column portion 160. As will be appreciated by those of skill in the art in view of the present disclosure, this provides the column assembly 110 with a composite construction that limits the thickness otherwise required by the column member sheet body 158 and the clamp member sheet body 101, simplifying the stamping and bending operations used to form the column member 152 and the clamp member 154 from the column member sheet body 158 and the clamp member sheet body 101, respectively.

The clamping portion 198 of the clamp member 154 may extend laterally from the base portion 103 of the clamp member 154. The clamping portion 198 may further laterally overlay both the ball member 156 (shown in FIG. 3) and the seating portion 162 of the column portion 160. It is contemplated that the clamping portion 198 urge the ball member 156 toward the seating portion 162 (shown in FIG. 5) of the column member 152 (shown in FIG. 3), compressing the ball member 156 within the pocket 186 (shown in FIG. 3) such that the ball member 156 is captive between the seating portion 162 of the column member 152 and the clamping portion 198 of the clamp member 154 by the radial clamping force 52 (shown in FIG. 3). As will be appreciated by those of skill in the art in view of the present disclosure, clamping the ball member 156 between the clamp member 154 and the column member 152 limits the number or parts otherwise required to fix the ball member 156 within the pocket 186, simplifying fabrication of the column assembly 110.

In certain examples, the base portion 103 of the clamp member 154 may be a first base portion 103 and that the clamp member 154 may have a second base portion 111. In such examples the second base portion 111 may extend in parallel with first base portion 103. The second base portion 111 may be connected to the first base portion 103 of the clamp member 154 by the clamping portion 198 of the clamp member 154. The second base portion 111 may also be spaced apart from the first base portion 103 by both the first column portion 160 (shown in FIG. 5) and the second column portion 178 (shown in FIG. 5) of the column member 152 (shown in FIG. 3). In this respect the first base portion 103 of the clamp member 154 (shown in FIG. 3) may be fastened to the first column portion 160 and the second base portion 111 may be fastened to second column portion 178 to be fix the clamp member 154 to the column member 152 as well as to clamp the ball member 156 within the column assembly 110 (shown in FIG. 2) between the column member 152 and the clamp member 154. As will be appreciated by those of skill in the art in view of the present disclosure, fastening the first base portion 103 and the second base portion 111 to the first column portion 160 and the second column portion 178 of the column member 152, respectively, can increase stiffness of the column assembly 110. Increasing stiffness of the column assembly 110 in turn allows the column member sheet body 158 and the clamp member sheet body 101 to be relatively thin, simplifying fabrication of the column assembly 110.

In certain examples, the clamping portion 198 may be a first clamping portion 198 and the clamp member 154 may have one or more second clamping portion 113. In such examples the second clamping portion 113 may be similar to the first clamping portion 198 and may be longitudinally spaced apart from the first clamping portion 198 along the longitudinal length of the first base portion 103 and the second base portion 111 of the clamp member 154. The second clamping portion 113 may be one of two clamping portions longitudinally spaced along first base portion 103 and the second base portion 111 of the clamp member 154. The second clamping portion 113 may be one of two or more second clamping portions longitudinally spaced along first base portion 103 and the second base portion 111 of the clamp member 154. For example, the second clamping portion 113 may be one of ten (10) or eleven (11) clamping portions longitudinally spaced along first base portion 103 and the second base portion 111 of the clamp member 154, the clamp member 154 having fewer clamping portions than seating portions of the column member 152. As will be appreciated by those of skill in the art in view of the present disclosure, clamp members having fewer clamping portions than seating portions of the column member can simplify fabrication of the column assembly, for example, by limiting the number of ball members positioned between the clamp member and the column member during assembly of the clamp member to the column member.

With continuing reference to FIG. 4, the clamp member 154 may be a first clamp member 154 and the column assembly 110 may further include a second clamp member 115 and a third clamp member 117. In such examples the second clamp member 115 and the third clamp member 117 may be similar to the first clamp member 154. The second clamp member 115 may be connected to the column member 152 at a location longitudinally between the first clamp member 154 and the top fastener tab 172, the third clamp member 117 may be connected to the column member 152 at a location longitudinally between the second clamp member 115 and the top fastener tab 172, and connection may be accomplished by fasteners received within the second clamp member 115 and the third clamp member 117. Advantageously, column assemblies having more than one clamp member simplify assembly of the column assembly by limiting the number of ball members to a number manageable by a single assembler, e.g., by limiting the number of ball members to ten (10) or eleven (11) ball members. Although shown and described herein as having three (3) clamp members, it is to be understood and appreciated that the column assembly 110 can have fewer or additional clamp members and remain within the scope of the present disclosure. Further, although shown and described herein as having a particular number of clamping portions, the second clamp member 115 having eleven (11) clamping portions while the first clamp member 154 and the third clamp member 117 having ten (10) clamping portions, it is to be understood and appreciated that the column assembly 110 can have one or more clamp member with fewer or additional clamping portions and remain within the scope of the present disclosure.

It is contemplated that the ball member 156 be formed from a ball member material 119. The ball member 156 may also have a diameter that is between about 1 millimeter and 10 millimeters, or between 2 millimeters and about 8 millimeters, or even between about 3 millimeters and about 6 millimeters. The ball member 156 may have a diameter that is about 4 millimeters. As will be appreciated by those of skill in the art, diameters within these ranges allow the ball member 156 to be both captive within the pocket 186 (shown in FIG. 3) and protrude in part above both the seating portion 162 (shown in FIG. 5) of the column member 152 and the clamping portion 198 (shown in FIG. 4) of the clamp member 154. Protrusion above the seating portion 162 and the clamping portion 198 allows the ball member 156 to space a substrate, the substrate 2 (shown in FIG. 1), with sufficient distance to avoid contact between the underside of the substrate and the seating portion 162 of the column member 152 as well as the clamping portion 198 of the clamp member 154. As will be appreciated by those of the skill in the art in view of the present disclosure, avoiding contact allows the metallic material 120 and/or the metallic material 130 forming the column member 152 and the clamp member 154 to include alloying elements otherwise prohibited is front-end (copper-free) semiconductor processing systems, such as copper, that can simplify die pressing and/or bending metallic sheet stock.

In certain examples, the ball member material 119 may include a ceramic material. For example, the ball member material 119 may include silicon nitride ($Si_3N_4$), zinc oxide ($ZnO_3$), aluminum oxide ($Al_2O_3$), or quartz. In accordance with certain examples, the ball member material 119 may consist of or consist essentially of a ceramic material, silicon nitride ($Si_3N_4$), zinc oxide ($ZnO_3$), aluminum oxide ($Al_2O_3$), or quartz. As will be appreciated by those of skill in the art in view of the present disclosure, such materials limit size of particulate shed during placement and removal of substrates from within the substrate storage rack 100, facilitating removal of the particulate with filtered air provided to the substrate storage rack 100. In certain examples the ball member material 119 may be matched to that forming contact pads carried by the end effector of either (or both) the front-end transfer robot 28 (shown in FIG. 1) and the back-end transfer robot 34 (shown in FIG. 1). As will also be appreciated by those of skill in the art in view of the present disclosure, matching the ball member material 119 to that forming the contact pads carried by the end effector of either (or both) the front-end transfer robot 28 and the back-end transfer robot 34 limits the potential sources of contamination within the semiconductor processing system 10. Examples of suitable ball members include G5 silicon nitride ceramic ball bearings, available from BC Precision of Chattanooga, Tennessee.

Figure 10:
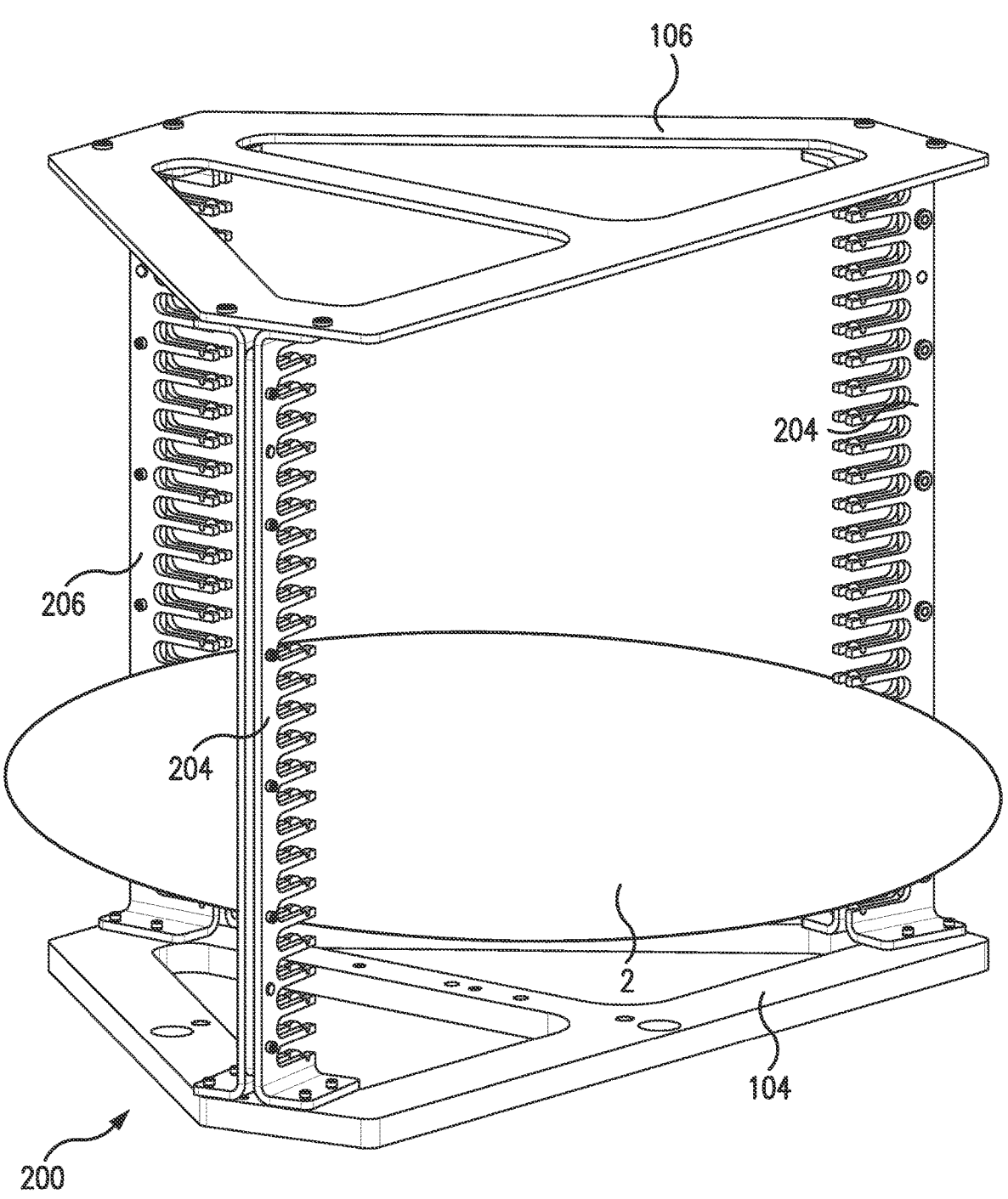
FIG. 10 is a perspective view of the substrate storage rack of FIG. 1 according to a second example, showing column assemblies connecting a top plate to a bottom plate within shroud to support substrates within slots defined by the column assemblies on ball members fixed within the column assembly.

With reference to FIGS. 10-15, a substrate storage rack 200 is shown. Referring to FIG. 10, the substrate storage rack 200 is similar to the substrate storage rack 100 (shown in FIG. 1) and additionally includes a column assembly 202. It is contemplated that the column assembly 202 may be a first column assembly 202 and that the substrate storage rack 200 may further include a second column assembly 204 and a third column assembly 206. The first column assembly 202 connects the top plate 106 to the bottom plate 104 and defines a plurality of slots 208 between the top plate 106 and the bottom plate 104. The second column assembly 204 and the third column assembly 206 are similar to the first column assembly 202 and are additionally offset from one another about the center of the substrate 2. In the illustrated example the second column assembly 204 and the third column assembly 116 are offset from the first column assembly 202 by about 90-degrees about the center of the substrate 2. In the illustrated example the third column assembly 206 is further spaced apart from the second column assembly by a distance that is less that the diameter of the substrate 2. For example, the third column assembly 206 may be spaced apart from the second column assembly by less than about 300 millimeters, or less than 290 millimeters, or even less than about 280 millimeters. As above, the substrate storage rack 200 may have fewer column assemblies or more column assemblies than shown in the illustrated example and remain within the scope of the present disclosure.

Figure 11:
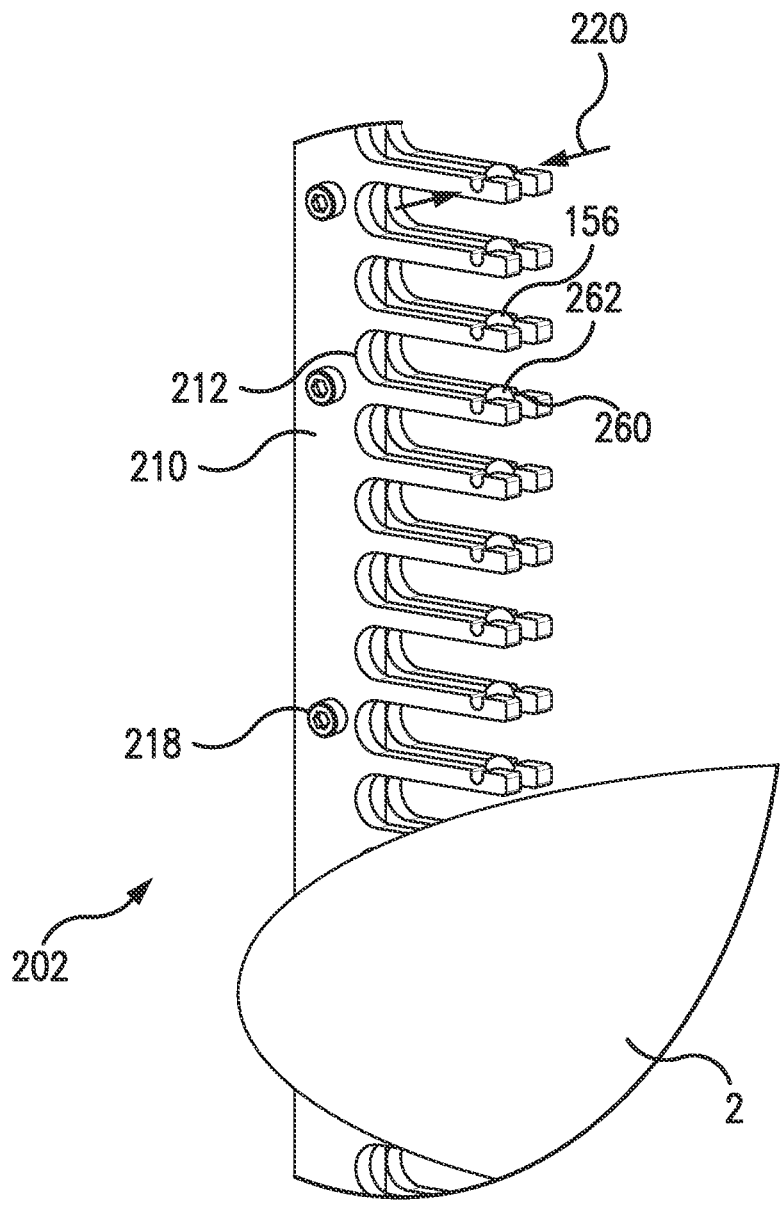
FIG. 11 is a perspective view of a portion of the substrate storage rack of FIG. 1 according to the second example, showing ball members fixed between seating portions of a column member and clamping portions of a clamp member by tangential clamping forces to support substrates on the column assembly.
Figure 12:
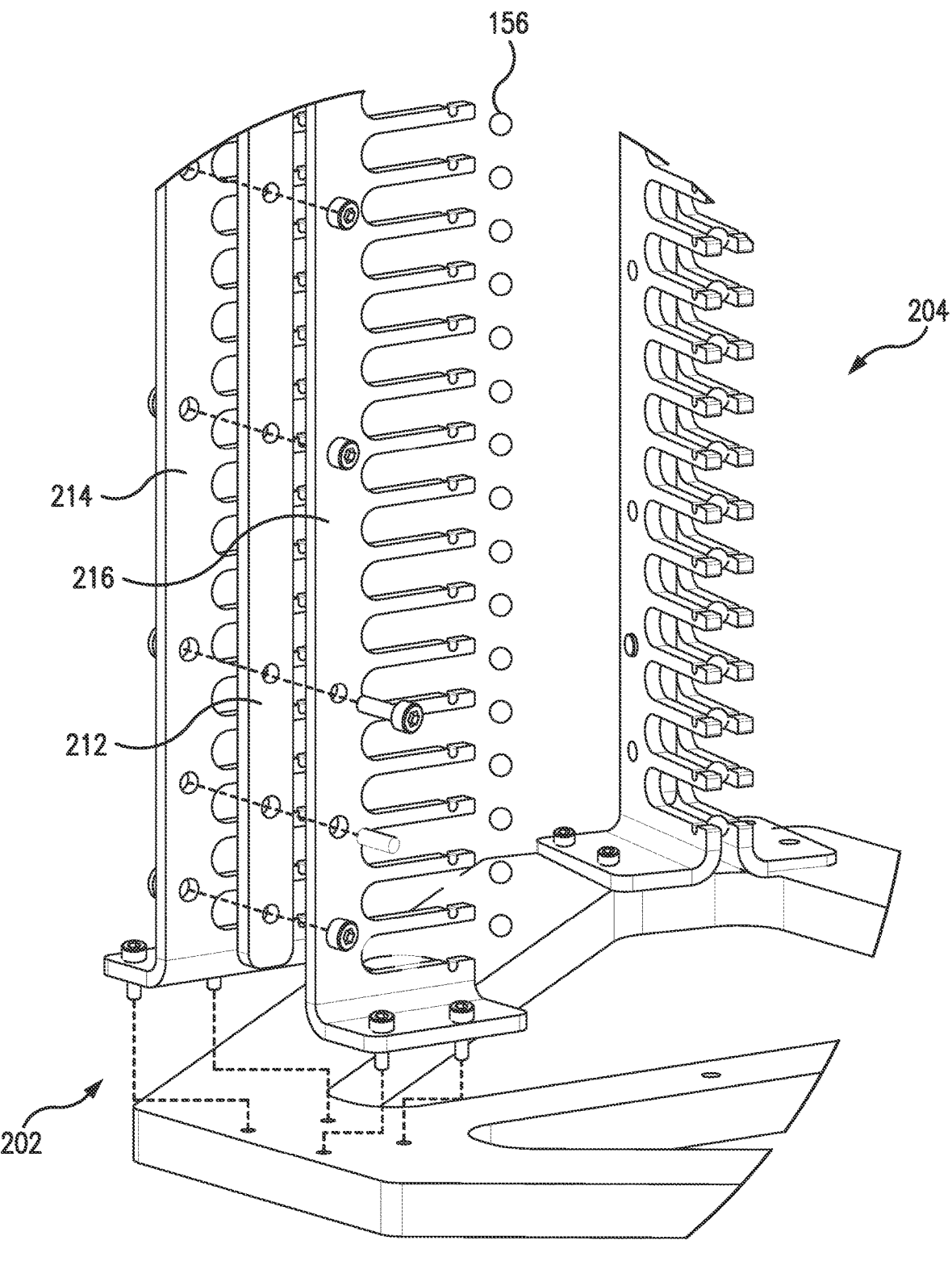
FIG. 12 is an exploded view of a portion of the substrate storage rack of FIG. 1 according to the first example, showing the clamp member, ball members, and a spacer member exploded away from the column member of the column assembly.

Referring to FIGS. 11 and 12, the first column assembly 202 includes a column member 210, a spacer member 212, a clamp member 214, and a plurality of ball members 156. The column member 210 extends longitudinally between the bottom plate 104 (shown in FIG. 2) and the top plate 106 (shown in FIG. 2). The spacer member 212 is arranged along a spacer member axis 216, is connected to the column member 210, and is parallel to the column member 210. The clamp member 214 is separated from the column member 210 by the spacer member 212, is coupled to the column member 210 by the spacer member 212 and extends in parallel with the column member 210. It is contemplated that the column member 210 and the clamp member 214 be compressively connected to one another by a plurality of fasteners 218 extending through the spacer member 212 and longitudinally spaced apart from one another along the spacer member axis 216. It is also contemplated that the plurality of ball members 156 be captive between the column member 210 and the clamp member 214 at locations radially inward of the spacer member 212. In this respect the plurality of ball members 156 are fixed within the column assembly 202 by tangential clamping forces 220 exerted by the column member 210 and the clamp member 214.

Referring to FIG. 13, the column member 210 includes a column member plate body 222 with a thickness 224, a column portion 226, and a seating portion 228. The column member plate body 222 may be formed from a metallic material 230 such as an aluminum-containing alloy or stainless steel. Examples of suitable aluminum-containing alloys and stainless-steel materials include 4040 aluminum and 304 stainless steel. In certain examples, the thickness 224 of the column member plate body 222 may be greater than the thickness 107 (shown in FIG. 9) of the clamp member sheet body 101 (shown in FIG. 8). In accordance with certain examples, the thickness 224 of the column member plate body 222 may be greater than the thickness 166 (shown in FIG. 6) of the column member sheet body 158 (shown in FIG. 5). For example, the thickness 224 of the column member plate body 222 may be between about 2 millimeters and about 20 millimeters, or between about 2 millimeters and about 15 millimeters, or even between about 2 millimeters and about 10 millimeters. The thickness 224 of the column member plate body 222 may be about 3 millimeters. As will be appreciated by those of skill in the art in view of present disclosure, thicknesses within the ranges simplifies fabrication of the column member 210.

The column portion 226 of the column member 210 has a longitudinal length 232 (shown in FIG. 10) spanning the bottom plate 104 (shown in FIG. 2) and the top plate 106 (shown in FIG. 2) of the substrate storage rack 200. The seating portion 228 of the column member 210 protrudes laterally from the column portion 226 of the column member 210 and radially inward relative to substrates, e.g., the substrate 2 (shown in FIG. 1), supported within the substrate storage rack 200. In certain examples, the seating portion 228 may be a first seating portion 228 and the column member 210 may have one or more second seating portion 234. In such examples, the second seating portion 234 may protrude laterally from the column portion 226 of the column member 210, may be spaced apart from the first seating portion 228 along the longitudinal length of the column member 210, and may be one of only two (2) seating portions arranged along the longitudinal length 232 of the column member 210. It is also contemplated that the first seating portion 228 and the second seating portion 234 may be two (2) of twenty-five (25) seating portions, or thirty-one (31) seating portions spaced apart from one another along the longitudinal length 232 of the column member 210. However, as will be appreciated by those of skill in the art in view of the present disclosure, the column member 210 may have fewer or more seating portions than shown and described herein and remain within the scope of the present disclosure.

Referring to FIG. 14, the spacer member 212 includes a spacer member plate body 236 with a thickness 238 and a plurality of fastener apertures 240 extending through the spacer member plate body 236. The plurality of fastener apertures 240 are longitudinally spaced apart from one another along the spacer member axis 216. In the illustrated example the spacer member 212 has eight (8) fastener apertures 240. As will be appreciated by those of skill in the art in view of the present disclosure, the spacer member 212 may have fewer or additional fastener apertures 240 and remain within the scope of the present disclosure.

The spacer member plate body 236 may be formed from a metallic material 242 such as an aluminum-containing alloy or stainless-steel material, and may be the same as the metallic material 230 forming the column member plate body 222. In certain examples, the thickness 238 of the spacer member plate body 236 be smaller than the diameter of the ball member 156. For example, the thickness 238 of the spacer member plate body 236 may be less than 4 millimeters, or less than 3 millimeters, or even less than 2 millimeters. It is also contemplated that, in accordance with certain examples, the thickness 238 of the spacer member plate body 236 may be greater than the thickness 107 (shown in FIG. 9) of the clamp member sheet body 101 (shown in FIG. 8) of the clamp member 154. In certain examples, the thickness 238 of the spacer member plate body 236 may be greater than the thickness 166 (shown in FIG. 6) of the column member sheet body 158 (shown in FIG. 5). For example, the thickness 238 may be between about 2 millimeters and about 20 millimeters, or between about 2 millimeters and about 15 millimeters, or even between about 2 millimeters and about 10 millimeters. In certain examples, the thickness 238 may be about 3 millimeters. As will be appreciated by those of skill in the art in view of present disclosure, thicknesses within the ranges can simplify assembly of the fabrication of the column assembly 202, for example, by controlling magnitude of the tangential clamping force 220 (shown in FIG. 11) according selection of thickness 238 of the spacer member plate body 236 and the diameter of the ball member 156.

Referring to FIG. 15, the clamp member 214 includes a clamp member plate body 244 with a thickness 246, a base portion 248, and a clamping portion 250. The clamp member plate body 244 may be formed from a metallic material 252, such as an aluminum-containing alloy or stainless steel like 4040 aluminum or 304 stainless steel, respectively. In certain examples, the metallic material 252 may the same as the metallic material 230 forming the column member plate body 222 and/or the metallic material 230 forming the spacer member plate body 236.

The thickness 246 may be greater than the thickness 107 (shown in FIG. 9) of the clamp member sheet body 101 (shown in FIG. 8), or greater than the thickness 166 (shown in FIG. 6) of the column member sheet body 158 (shown in FIG. 5). For example, the thickness 246 may be between about 2 millimeters and about 20 millimeters, or between about 2 millimeters and about 15 millimeters, or even between about 2 millimeters and about 10 millimeters. The thickness 224 of the clamp member plate body 244 may be about 3 millimeters. In certain examples, the thickness 246 may be or substantially equivalent to the thickness 224 (shown in FIG. 13) of the column member plate body 222 (shown in FIG. 13) and/or the thickness 238 (shown in FIG. 14) of the spacer member plate body 236 (shown in FIG. 14). As will be appreciated by those of skill in the art in view of present disclosure, matching thickness of the clamp member plate body 244 to the column member plate body 222 can limit deformation in one the seating portion 228 and the clamping portion 250 responsive to the tangential clamping force 220 exerted on the ball member 156 during assembly of the column assembly 202 (shown in FIG. 10), simplifying assembly of the column assembly 202.

The base portion 248 of the column member 210 has a longitudinal length 254. In certain examples the longitudinal length 254 may be substantially equivalent to the longitudinal length 232 of the column portion 226 (shown in FIG. 13) of the column member 210 (shown in FIG. 11). The clamping portion 250 of the clamp member 214 protrudes laterally from the base portion 248 of the column member 210. It is contemplated that the clamping portion 250 circumferentially overlap the seating portion 228 of the column member 210, the clamping portion 250 extending radially inward in this respect relative to substrates, e.g., the substrate 2 (shown in FIG. 1), supported within the substrate storage rack 100.

In certain examples, the clamping portion 250 may be a first clamping portion 250 and the clamp member 214 may have one or more second clamping portion 258. In such examples, the second clamping portion 258 may protrude laterally from the clamping portion 250 of the clamp member 214, may be spaced apart from the first clamping portion 256 along the longitudinal length 254 of the clamp member 214, and may be one of only two (2) clamping portions arranged along the longitudinal length 254 of the clamp member 214. In certain examples, the first clamping portion 256 and the second clamping portion 258 may be two (2) of twenty-five (25) seating portions, or thirty-one (31) seating portions spaced apart from one another along the longitudinal length 254 of the clamp member 214. It is also contemplated that, in accordance with certain examples, both the clamp member 214 and the column member 210 may have identical numbers of clamping portions and the seating portions. As will be appreciated by those of skill in the art in view of the present disclosure, forming the clamp member 214 and the column member 210 with the same number clamping and seating portions can simplify fabrication of the column assembly 202, for example, by limiting the number of detail parts included in the assembly and/or error-proofing the assembly. It is further contemplated that the seating portion the seating portion 228 and the clamping portion 250 may a first longitudinal slot 260 (shown in FIG. 11) and a tangentially opposed second longitudinal slot 262 (shown in FIG. 11) seating there is the ball member 156. As above, this simplifies the assembly of the column assembly 202 as the ball member 156 may be registered and thereafter maintained in one of the first longitudinal slot 260 and the second longitudinal slot 262, and thereafter clamped therein by force exerted about the other of the first longitudinal slot 260 and the second longitudinal slot 262 as the clamp member 214 is fastened to the column member 210.

With reference to FIG. 16, a method 300 of making a substrate storage rack, e.g., the substrate storage rack 100 (shown in FIG. 1), is shown. As shown with box 310, a column member, e.g., the column member 152 (shown in FIG. 3), is formed having a column portion, e.g., the column portion 160 (shown in FIG. 3), and a seating portion, e.g., the seating portion 162 (shown in FIG. 3), extending laterally from the column portion of the column member. In certain examples, the column member may be formed using a stamping operation, as shown with box 312. For example, the column member may be stamped from sheet stock, e.g., the column member sheet body 158 (shown in FIG. 5). In accordance with certain examples, the column member may be formed using a bending operation, for example, by bending the column member sheet body that a first column portion, e.g., the first column portion 160 (shown in FIG. 5), and a second column portion, e.g., the second column portion 178 (shown in FIG. 5), extend in parallel with one another on opposite sides of a column member axis, e.g., the column member axis 168 (shown in FIG. 6), as shown with box 314.

As shown with box 320, a clamp member, e.g., the clamp member 154 (shown in FIG. 3), is formed having a base portion, e.g., the base portion 103 (shown in FIG. 8), and a clamping portion, e.g., the clamping portion 198 (shown in FIG. 8), extending laterally from the base portion of the clamp. In certain examples, the clamp member may also be formed using a stamping operation, as shown with box 322. In this respect the clamp member may also be stamped from sheet stock, e.g., the clamp member sheet body 101 (shown in FIG. 8). In accordance with certain examples, the clamp member may be formed using a bending operation, for example, by bending the clamp member sheet body such that a first base portion, e.g., the first base portion 103 (shown in FIG. 8), and a second base portion, e.g., the second base portion 111 (shown in FIG. A), extend in parallel with one another.

As shown with box 330, a ball member, e.g., the ball member 156 (shown in FIG. 3), is supported on the seating portion of the column member. In certain examples, the ball member may be supported on a longitudinal slot defined by the seating portion of the column member, e.g., the longitudinal slot 188 (shown in FIG. 5), as shown with box 332.

In accordance with certain example, the ball member may be supported on a longitudinal slot defined by the clamping portion of the clamp member, e.g., the clamping portion longitudinal slot 208 (shown in FIG. 10). It is contemplated that the longitudinal slot maintain position of the ball member relative to at least one of the column member and the clamp member such that the clamp member may be registered to the column member using the ball member, as shown with box 340.

As shown with box 350, the ball member is thereafter compressed between the clamping portion of the clamp member and the seating portion of the column member. In certain examples, the ball member may be fixed between clamping portion and the seating portion by a radial clamping force exerted on the ball member by the seating portion and the clamping, the radial clamping force intersecting the column member axis, as shown with box 352. In accordance with certain examples, the ball member may be fixed between the clamping portion and the seating portion by a tangential clamping force exerted by the seating member and the clamp member on the ball member, the tangential clamping force not intersecting a spacer member axis within the column assembly, as shown with box 354. It is contemplated that the clamp member be fastened to the column member while exerting the clamping force on the ball member, the ball member thereby being compressive fixed within the column assembly between the seating portion of the column member and the clamping portion of the clamp member.

Although this disclosure has been provided in the context of certain examples, it will be understood by those skilled in the art that the disclosure extends beyond the specifically described embodiments to other alternative embodiments and/or uses of the examples and obvious modifications and equivalents thereof. In addition, while several variations of the examples of the disclosure have been shown and described in detail, other modifications, which are within the scope of this disclosure, will be readily apparent to those of skill in the art based upon this disclosure. It is also contemplated that various combinations or sub-combinations of the specific features and aspects of the examples may be made and still fall within the scope of the disclosure. It should be understood that various features and aspects of the disclosed examples can be combined with, or substituted for, one another in order to form varying modes of the examples of the disclosure. Thus, it is intended that the scope of the disclosure should not be limited by the particular examples described above. The headings provided herein, if any, are for convenience only and do not necessarily affect the scope or meaning of the devices and methods disclosed herein.

The invention claimed is:

1. A substrate storage rack, comprising:
a bottom plate;
a top plate spaced apart from the bottom plate; and
a column assembly connecting the top plate to the bottom plate and compressively seating therein a ball member, wherein the ball member protrudes from the column assembly in a direction toward the top plate to support thereon a substrate within the substrate storage rack, wherein the column assembly comprises:
a column member having a column portion and a seating portion, the column portion extending longitudinally between the bottom plate the and the top plate, the seating portion extending laterally from the column portion; and
a clamp member having a base portion and a clamping portion, the base portion extending longitudinally along the column portion of the column member, the clamping portion extending laterally from the base portion of the clamp member,
wherein the clamping portion compressively fixes the ball member against the seating portion within a pocket defined between the clamping portion of the column member and the seating portion of the clamp member.

2. The substrate storage rack of claim 1, wherein the ball member is formed from a ceramic material, and wherein the ball member has a diameter that is about 4 millimeters.

3. The substrate storage rack of claim 1, wherein the column assembly is a first column assembly and further comprising:
one or more second column assembly connecting the top plate to the bottom plate,
wherein the one or more second column assembly is spaced apart from the first column assembly by between about 100 millimeters and about 300 millimeters; and
a shroud member enclosing the bottom plate, the top plate, the first column assembly, and the one or more second column assembly.

4. The substrate storage rack of claim 1, wherein at least one of the seating portion and the clamping portion define a longitudinal slot having a rounded segment and a neck segment extending from the rounded segment, wherein the rounded segment has a diameter that is smaller than a diameter of the ball member, and wherein the ball member is fixed within the rounded segment of the longitudinal slot.

5. The substrate storage rack of claim 4, wherein the seating portion of column member defines the longitudinal slot.

6. The substrate storage rack of claim 4, wherein the longitudinal slot is a first longitudinal slot defined by the seating portion of the column member, wherein the clamping portion of the clamp member defines a second longitudinal slot, and wherein the ball member is further fixed within the second longitudinal slot of the clamping portion.

7. The substrate storage rack of claim 1, further comprising a spacer member coupling the clamp member to the column member, wherein the spacer member has a thickness, wherein the ball member has a diameter, and wherein the thickness of the spacer member is smaller than the diameter of the ball member.

8. The substrate storage rack of claim 1, wherein the column portion is a first column portion and the column member has a second column portion, wherein the second column portion extends in parallel with the first column portion, and wherein the seating portion of the column member connects the first column portion to the second column portion of the column member.

9. The substrate storage rack of claim 1, wherein the seating portion is a first seating portion and the column member has one or more second seating portion extending laterally from the column portion of the column member, wherein the one or more second seating portion is longitudinally spaced apart from the first seating portion of the column member.

10. The substrate storage rack of claim 1, wherein the clamping portion of the clamp member is a first clamping portion and the clamp member has one or more second clamping portion, and wherein the one or more second clamping portion is longitudinally spaced apart from the first clamping portion along a longitudinal length of the base portion of the clamp member.

11. The substrate storage rack of claim 1, wherein the clamp member is a first clamp member and further comprising one or more second clamp member connected to the column portion of the column member, wherein the one or more second clamp member is arranged longitudinally between the first clamp member and the top plate of the substrate storage rack.

12. The substrate storage rack of claim 1, wherein the ball member is a first ball member and further comprising one or more second ball member compressively seated within the column assembly, wherein the one or more second ball member protrudes from the column assembly in a direction toward the top plate, and wherein the one or more second ball member is longitudinally spaced apart from the first ball member along a longitudinal length of the column assembly.

13. A substrate storage rack, comprising:
a bottom plate;
a top plate spaced apart from the bottom plate; and
a column assembly connecting the top plate to the bottom plate and compressively seating therein a ball member, wherein the ball member protrudes from the column assembly in a direction toward the top plate to support thereon a substrate within the substrate storage rack, wherein the column assembly comprises:
a column member sheet body having column member sheet thickness; and
a clamp member sheet body having a clamp member sheet thickness, wherein the column member sheet thickness of the column member sheet body is greater than the clamp member sheet thickness of the clamp member sheet body.

14. The substrate storage rack of claim 13, wherein the column member sheet thickness is between about 1 millimeters and about 10 millimeters, wherein the clamp member sheet thickness is between about 1 millimeter and about 10 millimeters.

15. A pod, comprising:
an enclosure configured to seat on a load port of a semiconductor processing system;
a substrate storage rack as recited in claim 1, wherein the substrate storage rack is arranged within an interior of the enclosure.

16. A semiconductor processing system, comprising:
a front-end module with a front-end transfer robot;
a back-end module with a back-end transfer robot connected to the front-end module;
a process module with a heater or susceptor connected to the back-end module; and
a substrate storage rack as recited in claim 1, wherein the substrate storage rack is within a movement range of at least one of the front-end transfer robot and the back-end transfer robot.

17. The semiconductor processing system of claim 16, wherein the front-end module comprises a notch aligner, and wherein the substrate storage rack is arranged above the notch aligner and within the front-end module of the semi-conductor processing system.

18. The semiconductor processing system of claim 16, wherein the front-end module comprises a load lock, and wherein the substrate storage rack is arranged within the load lock of the semiconductor processing system.

19. A method of making a substrate storage rack, comprising:
forming a column member with a column portion and a seating portion extending laterally from the column member using a column member sheet body;
forming a clamp member with a base portion and a clamping portion extending laterally from the base portion using a clamp member sheet body;
supporting a ball member on the seating portion of the column member;
registering the clamp member to the column member using the ball member;
compressing the ball member between the seating portion of the column member and the clamping portion of the clamp member; and
fixing the ball member in compression between the seating portion of the column member and the clamping portion of the clamp member by fastening the base portion of the clamp member to the column portion of the column member.

* * * * *